(12) United States Patent
Zhang et al.

(10) Patent No.: US 12,178,061 B2
(45) Date of Patent: Dec. 24, 2024

(54) ORGANIC LIGHT EMITTING DIODE, MANUFACTURING METHOD THEREOF AND DISPLAY PANEL

(71) Applicant: BOE Technology Group Co., Ltd., Beijing (CN)

(72) Inventors: Xiaojin Zhang, Beijing (CN); Huiyun Yang, Beijing (CN); Changho Lee, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/600,278

(22) PCT Filed: Nov. 30, 2020

(86) PCT No.: PCT/CN2020/132673
§ 371 (c)(1),
(2) Date: Sep. 30, 2021

(87) PCT Pub. No.: WO2022/110113
PCT Pub. Date: Jun. 2, 2022

(65) Prior Publication Data
US 2024/0188318 A1    Jun. 6, 2024

(51) Int. Cl.
*H10K 50/12* (2023.01)
*H10K 101/20* (2023.01)
*H10K 101/30* (2023.01)

(52) U.S. Cl.
CPC ....... *H10K 50/121* (2023.02); *H10K 2101/20* (2023.02); *H10K 2101/30* (2023.02)

(58) Field of Classification Search
CPC ........... H10K 50/121; H10K 50/00–88; H10K 59/00–95; H10K 65/00;
(Continued)

(56) References Cited

U.S. PATENT DOCUMENTS

2019/0363271 A1\* 11/2019 Zhou ................... H10K 85/615
2021/0391392 A1\* 12/2021 Wang .................. H10K 50/125

FOREIGN PATENT DOCUMENTS

| CN | 106784354 A | 5/2017 |
| CN | 108511617 A | 9/2018 |

(Continued)

*Primary Examiner* — Mohammad A Rahman
(74) *Attorney, Agent, or Firm* — Nath, Goldberg & Meyer; Joshua B. Goldberg

(57) ABSTRACT

The disclosure relates to an organic light emitting diode, a method for manufacturing the same, and a display panel. The organic light emitting diode includes: a first electrode; a second electrode disposed opposite to the first electrode; a light-emitting layer between the first electrode and the second electrode; the light-emitting layer includes a first light-emitting sub-layer and a second light-emitting sub-layer; the first light-emitting sub-layer includes a host material, a TADF sensitizer and a fluorescent guest material; the second light-emitting sub-layer includes the host material or includes the host material and the TADF sensitizer. The light-emitting layer of the organic light emitting diode of the present disclosure includes the first light-emitting sub-layer and the second light-emitting sub-layer, and thus the luminous efficiency of the red light-emitting device, the green light-emitting device, and the blue light-emitting device can be harmonized by effectively adjusting a thickness of the second light-emitting sub-layer.

19 Claims, 6 Drawing Sheets

(58) Field of Classification Search
CPC ... H10K 71/00–861; H10K 85/00–791; H10K 2101/00–90; H10K 2102/00–361; B32B 2457/206

See application file for complete search history.

(56) References Cited

FOREIGN PATENT DOCUMENTS

| | | |
|---|---|---|
| CN | 109378392 A | 2/2019 |
| CN | 111653679 A | 9/2020 |
| WO | 2019009307 A1 | 1/2019 |

* cited by examiner

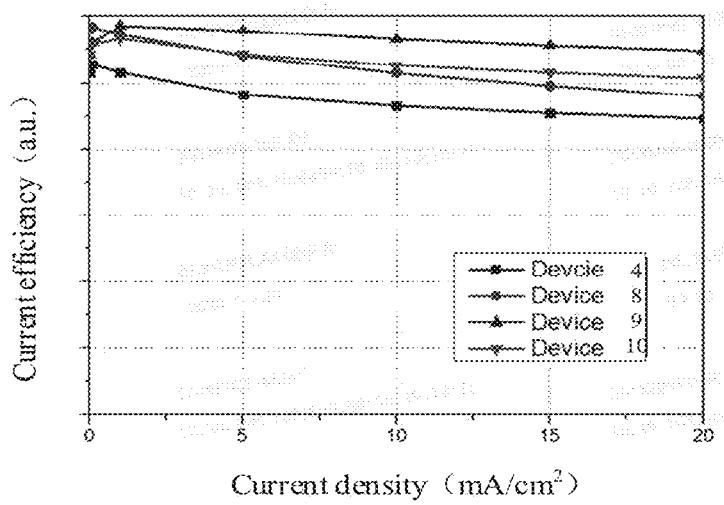

FIG. 9

| in a process chamber, simultaneously opening a host material evaporation source, a TADF sensitizer evaporation source and a fluorescent guest material evaporation source, to form the first light-emitting sub-layer comprising the host material, the TADF sensitizer and the fluorescent guest material through an evaporation process | — S10 |

| in the process chamber, simultaneously opening the host material evaporation source and the TADF sensitizer evaporation source and closing the fluorescent guest material evaporation source to form the second light-emitting sub-layer comprising the host material and the TADF sensitizer through an evaporation process, or in the process chamber, simultaneously opening the host material evaporation source and closing the fluorescent guest material evaporation source and the TADF sensitizer evaporation source to form the second light-emitting sub-layer comprising the host material through an evaporation process | — S20 |

FIG. 10

ORGANIC LIGHT EMITTING DIODE, MANUFACTURING METHOD THEREOF AND DISPLAY PANEL

This is a National Phase Application filed under 35 U.S.C. 371 as a national stage of PCT/CN2020/132673, filed Nov. 30, 2020, the content of each of which is hereby incorporated by reference in its entirety.

TECHNICAL FIELD

The present disclosure relates to the field of display technology, and in particular, relates to an organic light emitting diode, a method for manufacturing the organic light emitting diode, and a display panel.

BACKGROUND

The Thermally Activated Delayed Fluorescence (TADF) technology, as an organic light emitting diode technology with potential applications, has gained relatively rapid development in recent years and is known as the third generation OLED technology. The super-fluorescent technology based on a TADF sensitizer is considered as the TADF implementation scheme with the most application value, and particularly in the aspects of red and green OLEDs, and the TADF sensitizer is expected to replace a phosphorescence system and be matched with a blue fluorescence device to realize an efficient full-fluorescence display. However, compared with the current material system, the TADF device structure is different from the existing blue fluorescent structure, and mainly reflects that (1) the exciton recombination position is different, and (2) the light extraction optimization direction of the top-emission structure is different.

SUMMARY

The present disclosure provides an organic light emitting diode, a method for manufacturing the same, and a display panel.

In a first aspect, the organic light emitting diode includes a first electrode; a second electrode disposed opposite to the first electrode; a light-emitting layer between the first electrode and the second electrode; the light-emitting layer includes a first light-emitting sub-layer and a second light-emitting sub-layer arranged on the first light-emitting sub-layer proximal to the second electrode; the first light-emitting sub-layer includes a host material, a TADF sensitizer and a fluorescent guest material; the second light-emitting sub-layer includes the host material or includes the host material and the TADF sensitizer, and a mass percentage of the fluorescent guest material in the first light-emitting sub-layer is greater than a mass percentage of the fluorescent guest material in the second light-emitting sub-layer.

In an embodiment, a thickness of the first light-emitting sub-layer is in a range of 10 nm to 30 nm; a thickness of the second light-emitting sub-layer is in a range of 1 nm to 10 nm; and a ratio of the thickness of the second light-emitting sub-layer to the thickness of the first light-emitting sub-layer is less than ½.

In an embodiment, the thickness of the second light-emitting sub-layer is less than 6 nm.

In an embodiment, the second light-emitting sub-layer further includes the sensitizer; and a ratio of a mass percentage of the host material in the first light-emitting sub-layer to a mass percentage of the host material in the second light-emitting sub-layer is 0.8-1.2.

In an embodiment, the mass percentage of the fluorescent guest material in the first light-emitting sub-layer is between 0.5% and 3%.

In an embodiment, a difference between an S1 energy level and a T1 energy level of the host material is greater than 0.2 eV; a difference between an S1 energy level and a T1 energy level of the sensitizer is less than 0.2 eV; and a difference between an S1 energy level and a T1 energy level of the fluorescent guest material is greater than 0.2 eV; the S1 energy level of the host material is greater than the S1 energy level of the sensitizer, and the S1 energy level of the sensitizer is greater than the S1 energy level of the fluorescent guest material; and the T1 energy level of the host material is greater than the T1 energy level of the sensitizer.

In an embodiment, an absolute value of a difference between a HOMO level of the host material and a HOMO level of the sensitizer is less than 0.2 eV; an absolute value of a difference between a LUMO level of the host material and a LUMO level of the sensitizer is greater than 0.3 eV; an absolute value of a difference obtained by subtracting the S1 energy level of the sensitizer from an absolute value of a difference between the HOMO energy level of the host material and the LUMO energy level of the sensitizer is less than 0.2 eV; and an absolute value of a difference obtained by subtracting the T1 energy level of the sensitizer from an absolute value of a difference between the HOMO level of the host material and the LUMO level of the sensitizer is less than 0.2 eV.

In an embodiment, an overlapping area of an absorption spectrum of the fluorescent guest material and an electroluminescence spectrum of the sensitizer is more than 70% of an area of the electroluminescence spectrum of the sensitizer; and a difference between a wavelength of a lowest energy absorption peak of the fluorescent guest material and a wavelength of an electroluminescence peak of the sensitizer is less than or equal to 20 nm.

In an embodiment, a wavelength of a strongest emission peak of the host material is greater than a wavelength of a strongest emission peak of the sensitizer, and the wavelength of the strongest emission peak of the sensitizer is greater than a wavelength of a strongest emission peak of the fluorescent guest material.

In an embodiment, the organic light emitting diode further includes a hole blocking layer having a hole blocking material between the light-emitting layer and the second electrode, wherein a difference between a T1 energy level of the hole blocking material and the T1 energy level of the sensitizer is greater than 0.1 eV; and a difference between a HOMO level of the hole blocking material and the HOMO level of the host material is greater than 0.2 eV.

In an embodiment, the organic light emitting diode further includes an electron blocking layer having an electron blocking material between the light-emitting layer and the first electrode, wherein a difference between a T1 energy level of the electron blocking material and the T1 energy level of the sensitizer is greater than 0.1 eV; and a difference between a HOMO level of the electron blocking material and the HOMO level of the host material is less than or equal to 0.2 eV.

In an embodiment, the organic light emitting diode further includes a hole injection layer, a hole transport layer and a microcavity regulation layer sequentially arranged between the first electrode and the electron blocking layer; an electron transport layer and an electron injection layer sequentially arranged between the hole blocking layer and the second electrode; a light extraction layer arranged on the second electrode; and an encapsulation layer arranged on the light extraction layer.

In an embodiment, the first light-emitting sub-layer includes a red host material, a red TADF sensitizer and a red fluorescent guest material, or the first light-emitting sub-layer includes a green host material, a green TADF sensitizer and a green fluorescent guest material.

In a second aspect, a display panel is provided to include a plurality of pixel units, each of which includes a plurality of sub-pixels, wherein at least one of the plurality of sub-pixels includes the organic light emitting diode as mentioned above.

In an embodiment, the at least one sub-pixel includes a red sub-pixel, the first light-emitting sub-layer of the red sub-pixel includes a red first light-emitting sub-layer, and the second light-emitting sub-layer of the red sub-pixel includes a red second light-emitting sub-layer, wherein the red first light-emitting sub-layer includes a red host material, a red TADF sensitizer, and a red fluorescent guest material; the red second light-emitting sub-layer includes the red host material or includes the red host material and the red TADF sensitizer; and a mass percentage of the red fluorescent guest material in the red first light-emitting sub-layer is greater than a mass percentage of the red fluorescent guest material in the red second light-emitting sub-layer; the plurality of sub-pixels further comprise a green sub-pixel, which includes a green light-emitting layer having a green phosphorescent light-emitting material or a green light-emitting layer having a green host material, a green TADF sensitizer, and a green fluorescent guest material; and the plurality of sub-pixels further comprise a blue sub-pixel, which includes a blue light-emitting layer having a blue fluorescent light-emitting material.

In an embodiment, the plurality of sub-pixels includes a first anode of the red sub-pixel, a second anode of the green sub-pixel and a third anode of the blue sub-pixel arranged on the substrate at intervals; a monolithic hole injection layer on the first anode, the second anode and the third anode, and a monolithic hole transport layer on the hole injection layer; a red microcavity regulation layer arranged on the hole transport layer at a position corresponding to the first anode, and a green microcavity regulation layer arranged on the hole transport layer at a position corresponding to the second anode, wherein the green light-emitting layer is arranged on the green microcavity regulation layer; a red electron blocking layer arranged on the red microcavity regulation layer, the red first light-emitting sub-layer arranged on the red electron blocking layer, and the red second light-emitting sub-layer arranged on the red first light-emitting sub-layer; a blue electron blocking layer arranged on the hole transport layer at a position corresponding to the third anode, wherein the blue light-emitting layer is arranged on the blue electron blocking layer; and a monolithic hole blocking layer arranged on the red second light-emitting sub-layer, the green light-emitting layer and the blue light-emitting layer, a monolithic electron transport layer arranged on the hole blocking layer, a monolithic electron injection layer arranged on the electron transport layer, and a monolithic cathode arranged on the electron injection layer.

In an embodiment, the at least one sub-pixel includes a green sub-pixel, the first light-emitting sub-layer of the green sub-pixel includes a green first light-emitting sub-layer, and the second light-emitting sub-layer of the green sub-pixel includes a green second light-emitting sub-layer, wherein the green first light-emitting sub-layer includes a green host material, a green TADF sensitizer, and a green fluorescent guest material; a green second light-emitting sub-layer includes the green host material or includes the green host material and the green TADF sensitizer; and a mass percentage of the green fluorescent guest material in the green first light-emitting sub-layer is greater than a mass percentage of the green fluorescent guest material in the green second light-emitting sub-layer; the plurality of sub-pixels further comprise a red sub-pixel, which includes a red light-emitting layer having a red phosphorescent light-emitting material or a red light-emitting layer having a red host material, a red TADF sensitizer, and a red fluorescent guest material; and the plurality of sub-pixels further include a blue sub-pixel which includes a blue light-emitting layer having a blue fluorescent light-emitting material.

In an embodiment, the plurality of sub-pixels comprise a first anode of the red sub-pixel, a second anode of the green sub-pixel and a third anode of the blue sub-pixel arranged on the substrate at intervals; a monolithic hole injection layer on the first anode, the second anode and the third anode and a monolithic hole transport layer on the hole injection layer; a red microcavity regulation layer arranged on the hole transport layer at a position corresponding to the first anode, and a green microcavity regulation layer arranged on the hole transport layer at a position corresponding to the second anode, wherein the red light-emitting layer is arranged on the red microcavity regulation layer; a green electron blocking layer on the green microcavity regulation layer, a green first light-emitting sub-layer on the green electron blocking layer, and a green second light-emitting sub-layer on the green first light-emitting sub-layer; a blue electron blocking layer on the hole transport layer at a position corresponding to the third anode, wherein the blue light-emitting layer is arranged on the blue electron blocking layer; and a monolithic hole blocking layer arranged on the green second light-emitting sub-layer, the red light-emitting layer, and the blue light-emitting layer, a monolithic electron transport layer arranged on the hole blocking layer, a monolithic electron injection layer arranged on the electron transport layer and a monolithic cathode arranged on the electron injection layer.

In an embodiment, the at least one sub-pixel includes a green sub-pixel, the first light-emitting sub-layer of the green sub-pixel includes a green first light-emitting sub-layer, and the second light-emitting sub-layer of the green sub-pixel includes a green second light-emitting sub-layer, wherein the green first light-emitting sub-layer includes a green host material, a green TADF sensitizer, and a green fluorescent guest material; the green second light-emitting sub-layer includes the green host material or includes the green host material and the green TADF sensitizer; and a mass percentage of the green fluorescent guest material in the green first light-emitting sub-layer is greater than a mass percentage of the green fluorescent guest material in the green second light-emitting sub-layer; the at least one sub-pixel includes a red sub-pixel, the first light-emitting sub-layer of the red sub-pixel includes a red first light-emitting sub-layer, and the second light-emitting sub-layer of the red sub-pixel includes a red second light-emitting sub-layer, wherein the red first light-emitting sub-layer includes a red host material, a red TADF sensitizer, and a red fluorescent guest material; the red second light-emitting sub-layer includes the red host material or includes the red host material and the red TADF sensitizer; and a mass percentage of the red fluorescent guest material in the red first light-emitting sub-layer is greater than a mass percentage of the red fluorescent guest material in the red second light-emitting sub-layer; and the plurality of sub-pixels further comprise a blue sub-pixel, which includes a blue light-emitting layer having a blue fluorescent light-emitting material.

In an embodiment, the plurality of sub-pixels comprise a first anode of the red sub-pixel, a second anode of the green sub-pixel and a third anode of the blue sub-pixel arranged on the substrate at intervals; a monolithic hole injection layer arranged on the first anode, the second anode and the third anode and a monolithic hole transport layer arranged on the hole injection layer; a red microcavity regulation layer arranged on the hole transport layer a position corresponding to the first anode, and a red electron blocking layer arranged on the red microcavity regulation layer wherein the red first light-emitting sub-layer is arranged on the red electron blocking layer and the red second light-emitting layer is arranged on the red first light-emitting sub-layer; a green microcavity regulation layer arranged on the hole transport layer a position corresponding to the second anode, and a green electron blocking layer arranged on the green microcavity regulation layer wherein the green first light-emitting sub-layer is arranged on the green electron blocking layer and the green second light-emitting layer is arranged on the green first light-emitting sub-layer; a blue electron blocking layer arranged on the hole transport layer a position corresponding to the third anode wherein the blue light-emitting layer is arranged on the blue electron blocking layer; and a monolithic hole blocking layer on the green second light-emitting sub-layer, the red second light-emitting sub-layer and the blue light-emitting layer, a monolithic electron transport layer on the hole blocking layer, a monolithic electron injection layer on the electron transport layer and a monolithic cathode on the electron injection layer.

In an embodiment, the blue light-emitting layer includes a blue host material and a blue guest material; a difference between a T1 energy level of a hole blocking material of the hole blocking layer and a T1 energy level of the blue host material is greater than 0.1 eV; and a difference between a HOMO level of the hole blocking material of the hole blocking layer and a HOMO level of the blue host material is greater than 0.2 eV.

In a third aspect, a method for manufacturing the above organic light emitting diode is provided to include: in a process chamber, simultaneously opening a host material evaporation source, a TADF sensitizer evaporation source and a fluorescent guest material evaporation source, to form the first light-emitting sub-layer comprising the host material, the TADF sensitizer and the fluorescent guest material through an evaporation process; and in the process chamber, simultaneously opening the host material evaporation source and the TADF sensitizer evaporation source and closing the fluorescent guest material evaporation source to form the second light-emitting sub-layer comprising the host material and the TADF sensitizer through an evaporation process, or in the process chamber, simultaneously opening the host material evaporation source and closing the fluorescent guest material evaporation source and the TADF sensitizer evaporation source to form the second light-emitting sub-layer comprising the host material through an evaporation process.

BRIEF DESCRIPTION OF DRAWINGS

In accordance with various disclosed embodiments, the following figures are merely examples for illustrative purposes and are not intended to limit the scope of the disclosure

FIG. 9 is a schematic diagram illustrating relationship between current density and current efficiency of organic light emitting diodes having different light-emitting layers according to an embodiment of the present disclosure; and FIG. 10 shows a flow chart of a method for manufacturing an organic light emitting diode according to an embodiment of the present disclosure.

DETAIL DESCRIPTION OF EMBODIMENTS

The present disclosure will now be described in detail with reference to the following examples. It should be noted that, the following description of some embodiments presented herein is for the purpose of illustration and description only. It is not intended to be exhaustive or to be limited to the precise form disclosed.

In the related art, a red or green OLED device generally employs a phosphorescence emission mechanism, and a blue OLED device generally employs a fluorescence emission mechanism. When the OLED display panel combining the phosphorescence emission mechanism and the fluorescence emission mechanism implements a full-color display scheme, since the light-emitting center positions of the OLED devices of various colors are different, in order to satisfy the efficiency of the OLED devices of various colors, the manufacturing procedure is very complicated, which results in a significant increase in manufacturing cost.

Regarding preparation of the red OLED or the blue OLED by the phosphorescence emission mechanism, a related technology has proposed that a super-fluorescent technology based on a TADF sensitizer is adopted to replace the red and green OLEDs of the phosphorescence emission mechanism to prepare a super-fluorescent red OLED device or green OLED device, and the blue fluorescence OLED device is further combined to realize an efficient full-fluorescence display panel. However, compared with the current material system, the structure of the TADF sensitizer-based OLED device is different from the current blue fluorescent structure, and the differences mainly include: (1) different exciton recombination positions, and (2) different light extraction optimization directions of the top emission structures.

In view of the above problems, the present disclosure provides, inter alia, an organic light emitting diode to adjust a light-emitting center position of the organic light emitting diode based on a TADF sensitizer, so as to be easily compatible with organic light emitting diodes of other fluorescence mechanisms, thereby more easily implementing a full-color display panel.

Figure 1:
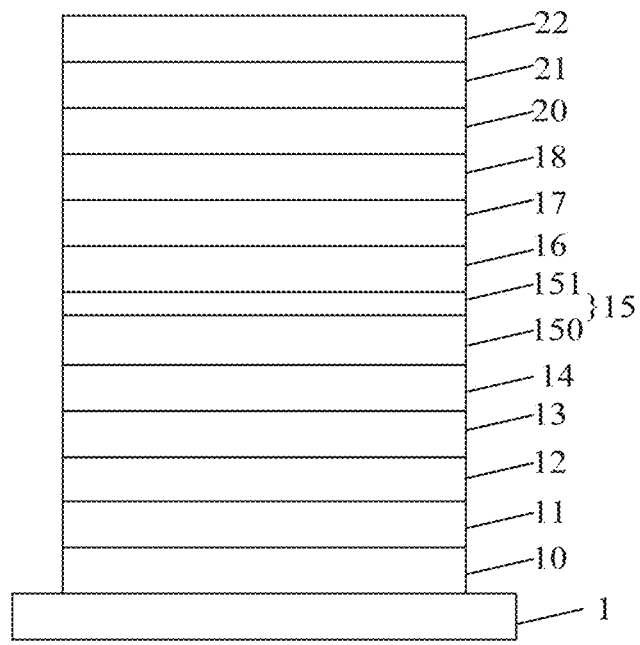
FIG. 1 shows a schematic structural diagram of an organic light emitting diode according to an embodiment of the present disclosure.

As shown in FIG. 1, the organic light emitting diode of the present disclosure may include a substrate 1, and a first electrode 10, a hole injection layer (HIL) 11, a hole transport layer (HTL) 12, a microcavity regulation layer (Cavity controller) 13, an electron blocking layer (EBL) 14, a light-emitting layer (EML) 15, a hole blocking layer (HBL) 16, an electron transport Layer (ETL) 17, an electron injection layer (EIL) 18, a second electrode 20, a light extraction layer (CPL) 21, and an encapsulation layer 22, which are sequentially disposed on the substrate 1.

The organic light emitting diode of the present disclosure is not limited to the organic light emitting diode as shown in FIG. 1, and for example, it may only include the first electrode 10, the light-emitting layer 15, and the second electrode 20. That is, the specific configuration of the organic light emitting diode may be determined according to specific needs, and the present disclosure is not limited thereto.

In the present disclosure, the first electrode 10 may be an anode, for example, may be a total reflection anode, and the second electrode 20 may be a cathode, for example, may be a semi-reflection cathode. When a driving current is supplied to the OLED, electrons are injected from the second electrode 20 into the light-emitting layer 15, holes are injected from the first electrode 10 into the light-emitting layer 15, the injected electrons and holes are transported by an electric field, the electrons and holes are recombined in the light-emitting layer 15 by coulomb interaction, excitons are generated, and photons are released to emit light while the excitons return from an excited state to a ground state (this is an exciton de-excitation light emission procedure).

As shown in FIG. 1, the light-emitting layer 15 of the organic light emitting diode of the present disclosure includes a first light-emitting sub-layer 150 and a second light-emitting sub-layer 151, wherein the second light-emitting sub-layer 151 is in direct contact with the first light-emitting sub-layer 150 and is closer to the second electrode (i.e., cathode) than the first light-emitting sub-layer 150. A thickness of the first light-emitting sub-layer 150 is in a range of 10 nm to 30 nm. The first light-emitting sub-layer 150 may include a host material A, a TADF sensitizer B, a fluorescent guest material C (not a TADF material). A doping concentration of the fluorescent guest material C in the first light-emitting sub-layer is very small, and may be generally in a range of 0.5-3%; a mass ratio of the host material A to the TADF sensitizer B is X, wherein 5%<X<50%. The host material A in the first light-emitting sub-layer 150 is a bipolar material, and has a hole mobility at least 1 order of magnitude higher than an electron mobility, i.e., the hole mobility of the host material A is at least 10 times higher than the electron mobility of the host material A. A lowest singlet excited state S1 (i.e., S1 energy level) and a lowest triplet state T1 (i.e., T1 energy level) of each of the three materials, the host material A, the TADF sensitizer B and the fluorescent guest material C, should satisfy the following: a difference between the S1 energy level and the T1 energy level of the host material A is greater than 0.2 eV (i.e., S1(A)–T1(A)>0.2 eV); a difference between the S1 energy level and the T1 energy level of the TADF sensitizer B is less than 0.2 eV (i.e., S1(B)–T1(B) <0.2 eV); a difference between the S1 energy level and the T1 energy level of the fluorescent guest material C is greater than 0.2 eV (i.e., S1(C)–T1(C)>0.2 eV). The TADF sensitizer B has delayed fluorescence characteristics. The S1 energy levels of the three materials, the host material A, the TADF sensitizer B and the fluorescent guest material C, should satisfy the following: the S1 energy level of the host material A is greater than the S1 energy level of the TADF sensitizer B, which in turn is greater than the S1 energy level of fluorescent guest material C (i.e., S1(A)>S1(B)>S1 (C)); the T1 energy levels of the host material A and the TADF sensitizer B should satisfy the following: the T1 energy level of the host material A is greater than the T1 energy level of the TADF sensitizer B (i.e., T1(A)>T1(B)).

An absolute value of a difference between a highest occupied molecular orbital energy level (i.e., HOMO energy level) of the host material A and the HOMO energy level of the TADF sensitizer B is less than 0.2 eV (i.e., |HOMO(A)–HOMO(B)|<0.2 eV); an absolute value of a difference between a lowest unoccupied molecular orbital energy level (i.e., LUMO energy level) of the TADF sensitizer B and the LUMO energy level of the host material A is greater than 0.3 ev (i.e., |LUMO(B)–LUMO(A)|>0.3 eV); an absolute value of a difference obtained by subtracting the S1 energy level of the TADF sensitizer B from an absolute value of a difference between the HOMO energy level of the host material A and the LUMO energy level of the TADF sensitizer B is less than 0.2 eV (i.e., |HOMO(A)–LUMO (B)|–S1(B)|<0.2 eV); and an absolute value of a difference obtained by subtracting the T1 energy level of the TADF sensitizer B from an absolute value of a difference between the HOMO level of the host material A and the LUMO level of the TADF sensitizer B is less than 0.2 eV (i.e., |HOMO (A)–LUMO(B)|–T1(B)|<0.2 eV).

Figure 5:
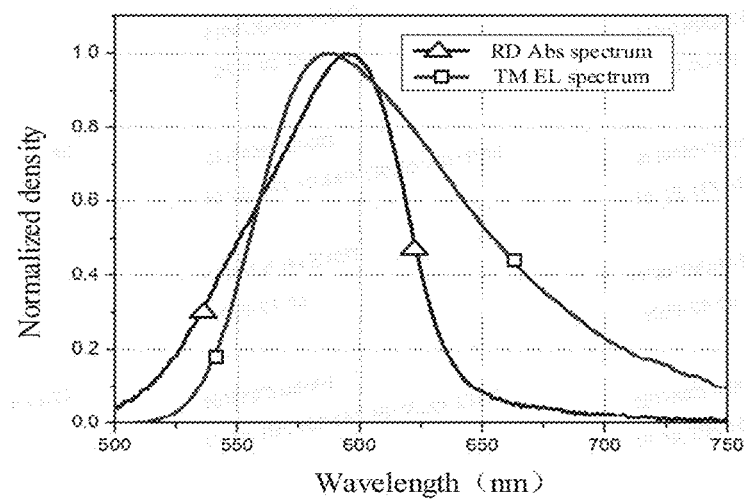
FIG. 5 is a schematic diagram illustrating characteristics of materials of light-emitting layers of an organic light emitting diode according to an embodiment of the present disclosure.

In one embodiment, as shown in FIG. 5, an absorption spectrum (RD Abs spectrum) of the fluorescent guest material C and an electroluminescence spectrum (TH EL spectrum) of the TADF sensitizer B need to have a large overlapping area therebetween. For example, an overlapping area between the absorption spectrum of the fluorescent guest material C with the electroluminescence spectrum of the TADF sensitizer B is more than 70% of an area of the electroluminescence spectrum of the TADF sensitizer B. In one embodiment, a wavelength of an energy minimum absorption peak of the fluorescent guest material C differs from a wavelength of an electroluminescence peak of the TADF sensitizer B by no more than 20 nm.

In one embodiment, a wavelength of a strongest emission peak of the host material A is greater than a wavelength of a strongest emission peak of the TADF sensitizer B, which in turn is greater than a wavelength of a strongest emission peak of the fluorescent guest material C (i.e., λ(A)>λ(B)>λ (C)).

In one embodiment, the second light-emitting sub-layer 151 has a thickness in the range of 1 nm to 10 nm, and may include only two materials of a host material A and a TADF sensitizer B; it may of course alternatively include only the host material A and not include the TADF sensitizer B.

A ratio of a thicknesses of the second light-emitting sub-layer 151 to a thickness of the first light-emitting sub-layer 150 may be less than ½, i.e., the thickness of the first light-emitting sub-layer functioning to emit light needs to be greater than 2 times the thickness of the second light-emitting sub-layer. In one embodiment, the thickness of the second light-emitting sub-layer may be less than 6 nm. When the second light-emitting sub-layer 151 includes the host material A and the TADF sensitizer B, a mass ratio of the host material A to the TADF sensitizer B in the second light-emitting sub-layer may be substantially the same as a mass ratio of the host material A to the TADF sensitizer B in the first light-emitting sub-layer, for example, a ratio between the mass percentage of the host material in the first light-emitting sub-layer and the mass percentage of the host material in the second light-emitting sub-layer ranges from 0.8 to 1.2. The difference between the first light-emitting sub-layer and the second light-emitting sub-layer is that the first light-emitting sub-layer contains a small amount of the fluorescent guest material, and the mass percentage of the fluorescent guest material in the first light-emitting sub-layer is about 0.5-3%. In one embodiment, the mass percentage of the fluorescent guest material in the first light-emitting sub-layer is 1%. In the present disclosure, the respective materials of the first and second light-emitting sub-layers may be formed by co-evaporation of a plurality of sources.

The present disclosure further provides a method for manufacturing the above organic light emitting diode, as shown in FIG. 10, which may include:

Step S10, in a process chamber, simultaneously opening a host material evaporation source, a TADF sensitizer evaporation source and a fluorescent guest material evaporation source, and forming the first light-emitting sub-layer including the host material, the TADF sensitizer and the fluorescent guest material through an evaporation process;

Step S20, in the same process chamber, simultaneously opening the host evaporation source and the TADF sensitizer evaporation source, and closing the fluorescent guest evaporation source, and forming the second light-emitting sub-layer including the host material and the TADF sensitizer through an evaporation process, or, in the same process chamber, simultaneously opening the host evaporation source and closing the fluorescent guest evaporation source and the TADF sensitizer evaporation source, and forming the second light-emitting sub-layer including the host material through an evaporation process. The method can greatly reduce the procedure complexity of the organic light emitting diode with the double-layer light emitting layer.

In general, when the first light-emitting sub-layer and the second light-emitting sub-layer are formed by selectively opening and closing a plurality of evaporation sources in the same chamber, a small amount of the fluorescent guest material may be contained in the second light-emitting sub-layer due to process errors due to and a limitation in process accuracy. This small amount of the fluorescent guest material may cause the second light-emitting sub-layer to emit light. On one hand, the microcavity of the top-emission type organic light emitting diode has selectivity on the wavelength of the emitted light; on the other hand, the guest material is selected in consideration of the forester energy transfer with the corresponding sensitizer, so that this part of energy is transferred to the first light-emitting sub-layer, and the wavelength of emergent light of the organic light emitting diode cannot be influenced by light caused by the small amount of the fluorescent guest material in the second light-emitting sub-layer.

The organic light emitting diode proposed by the present disclosure is particularly suitable for a green OLED and a red OLED. The green OLED and the red OLED in the related art each generally adopt a light-emitting layer of a phosphorescence emission mechanism or adopt a TADF super-fluorescent emission mechanism, but whichever emission mechanism adopted, the structures of the green OLED and the red OLED are greatly different from the structure of the blue fluorescence OLED, which may lead to a complicated procedure or may not maximize the luminous efficiency of the OLEDs of various colors when a full-color display is realized. To this end, the present disclosure is proposed to provide improved green and red super-fluorescent OLEDs based on TADF sensitizers. The specific structure of the super-fluorescent OLED disclosed by the present disclosure enables high efficiencies of red super-fluorescent OLED and green super-fluorescent OLED sub-pixels to be obtained while luminous efficiency of the blue fluorescent OLED is maximized when the super-fluorescent OLEDs and the blue fluorescent OLED are constructed for a full-color display, thereby achieving an efficient full-color scheme.

The first light-emitting sub-layer of an OLED with dual light-emitting layers according to the present disclosure includes a red host material, a red TADF sensitizer, and a red fluorescent guest material when the organic light emitting diode emits red light; the OLED having dual light-emitting layer according to the present disclosure includes a first light-emitting sub-layer including a green host material, a green TADF sensitizer, and a green fluorescent guest material when the organic light emitting diode emits green light.

For example, the T1 energy level of the red host material is greater than 2.7 eV, while the T1 energy level of the green host material is greater than 2.6 eV. The red host material or the green host material may be carbazole-based derivatives, arylsilane derivatives, and the like, for example, as in the following examples 1-1 to 1-3:

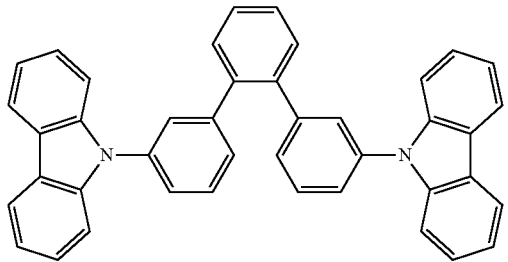

(1-1)

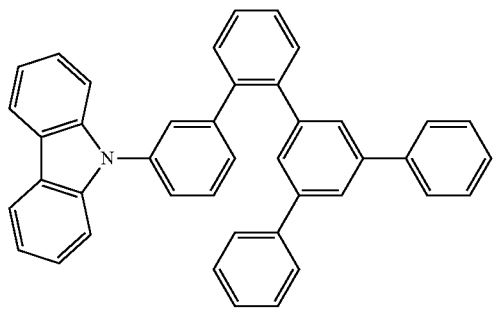

(1-2)

-continued (1-3)

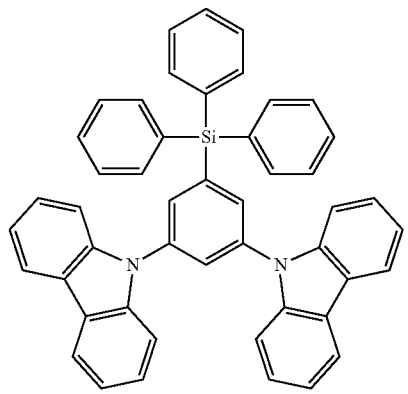

For example, a green sensitizer has a T1 energy level greater than 2.6 eV and a red sensitizer has a T1 energy level greater than 2.5 eV, and the red sensitizer or the green sensitizer may be a derivative having one or more D-A structures such as triazines, pyridines, ketones, quinones, furans, and the like, for example, as shown in the following examples 2-1 to 2-3:

(2-1)

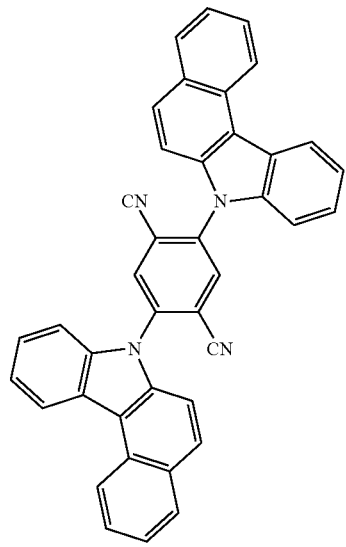

(2-2)

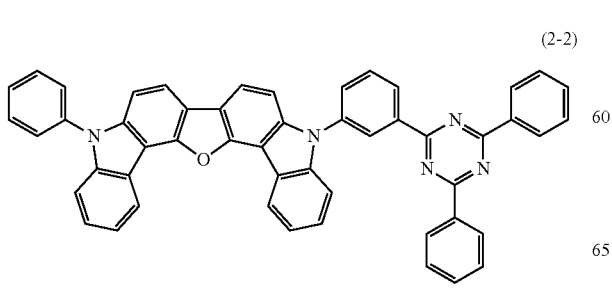

-continued (2-3)

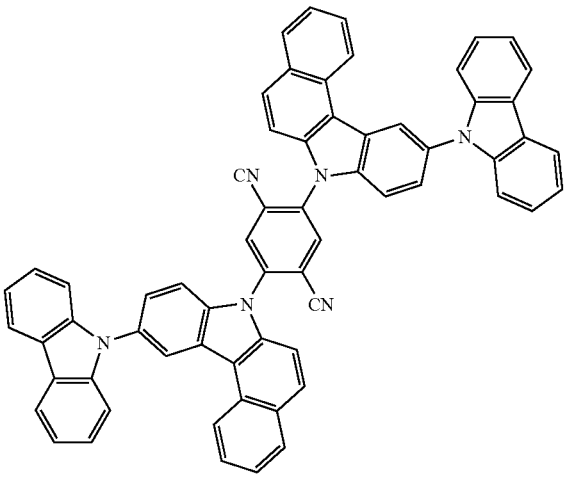

For example, a selection of the red guest material and the green guest material primarily considers the forester energy transfer with the corresponding sensitizer, and the red guest material and the green guest material each may be a borofluoride type material, such as the following examples 3-1 to 3-3:

(3-1)

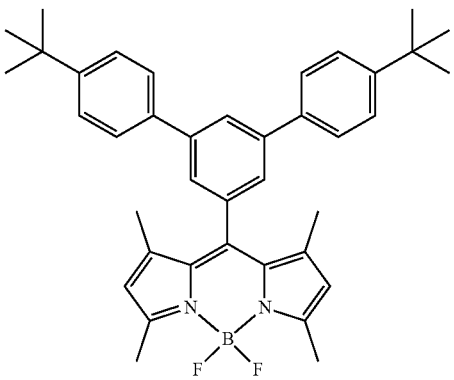

(3-2)

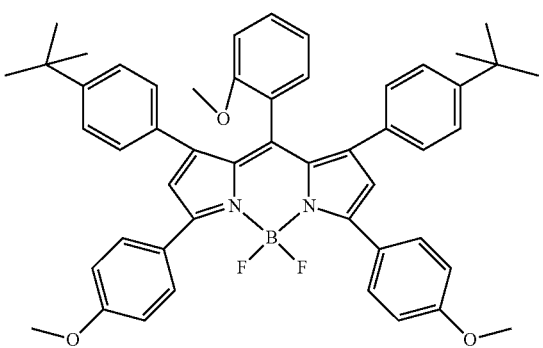

(3-3)

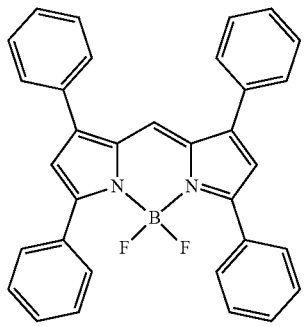

In the super-fluorescent OLED of the present disclosure, the first light-emitting sub-layer in the light-emitting layer of the double-layer structure mainly plays a role of luminescence, a thickness and a position of the first light-emitting sub-layer determine a light-emitting center position of the OLED, and the second light-emitting sub-layer does not play a role of luminescence, and functions as the following: on one hand, a distance between the light-emitting center position in the light-emitting layer and the cathode layer is adjusted to be consistent with thickness requirements on the electron transport layer of the blue fluorescent OLED (which will be described in detail in the following embodiments); on the other hand, since the composition of the second light-emitting sub-layer is almost the same as that of the first light-emitting sub-layer, the only different is that the second light-emitting sub-layer does not include the fluorescent guest material of the first light-emitting sub-layer, but is composed of the same materials of the light-emitting host material and the TADF sensitizer as in the first light-emitting sub-layer, and the mass ratio of the light-emitting host material to the TADF sensitizer in the first light-emitting sub-layer is very close to that in the second light-emitting sub-layer, the purpose of this selection is to facilitate energy level matching between the layers and charge balance between the layers when emitting light, and in addition, the second light-emitting sub-layer mainly functions as an optical output tuner, and an exciton generation layer. In an actual production, if different evaporation rates are adopted, additional evaporation sources and flow control are needed, which increases the cost. Therefore, when the second light-emitting sub-layer is prepared, the film forming conditions which are the same as those of the corresponding materials in the first light-emitting sub-layer are adopted, equipment multiplexing can be realized, the procedure is optimized, and no additional cost is increased.

The present disclosure further provides a display panel based on the above organic light emitting diode, the display panel includes a plurality of pixel units, each of which includes a plurality of sub-pixels, and at least one of the sub-pixels includes the organic light emitting diode of the embodiment of the present disclosure.

Figure 2:
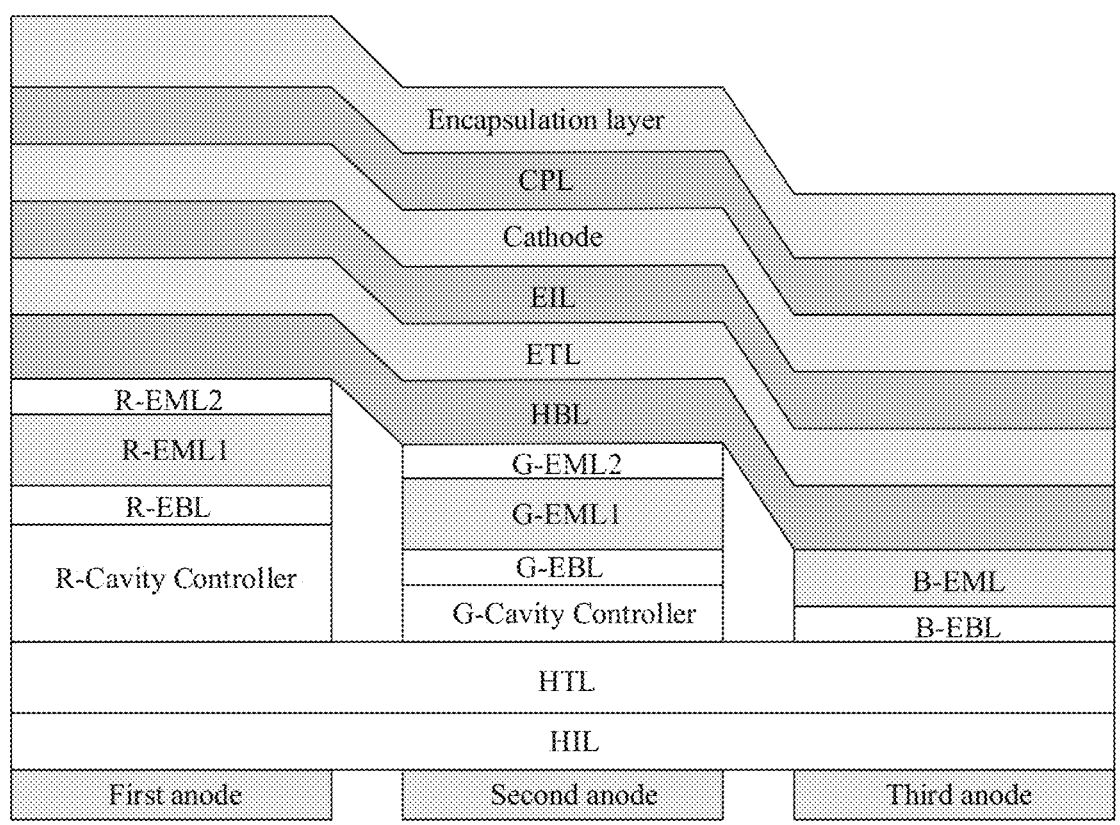
FIG. 2 shows a schematic structural diagram of a pixel unit according to an embodiment of the disclosure.

As shown in FIG. 2, one pixel unit of an embodiment of the present disclosure includes red, green, and blue OLEDs. In the embodiment shown in FIG. 2, the red OLED and the green OLED of the pixel unit are both organic light emitting diodes according to the above-described embodiments of the present disclosure, that is, the light-emitting layer of the red OLED includes a red first light-emitting sub-layer R-EML1 and a red second light-emitting sub-layer R-EML2; the light-emitting layer of the green OLED includes a green first light-emitting sub-layer G-EML1 and a green second light-emitting sub-layer G-EML2. In the embodiment, the pixel unit adopts the red and green OLEDs adopting the super-fluorescent light-emitting mechanism, which are combined with the blue OLED with the blue fluorescence light-emitting material of the conventional fluorescence light-emitting mechanism, so that a full-color display panel of the full-fluorescence system is realized.

Specifically, the display panel shown in FIG. 2 includes a first anode of a red sub-pixel, a second anode of a green sub-pixel, and a third anode of a blue sub-pixel, which are disposed at intervals on, for example, a substrate; a bulk hole injection layer HIL disposed on the first, second, and third anodes, and a bulk hole transport layer HTL disposed on the hole injection layer HIL; a red microcavity regulation layer R-Cavity Controller disposed on the hole transport layer HTL at a position corresponding to the first anode, and a red electron blocking layer R-EBL disposed on the red microcavity regulation layer R-Cavity Controller, wherein the red first light-emitting sub-layer R-EML1 is disposed on the red electron blocking layer R-EBL, and the red second light-emitting sub-layer R-EML2 is disposed on the red first light-emitting sub-layer R-EML1; a green microcavity regulation layer G-Cavity Controller arranged on the hole transport layer HTL at a position corresponding to the second anode, and a green electron blocking layer G-EBL arranged on the green microcavity regulation layer G-Cavity Controller, wherein the green first light-emitting sub-layer G-EML1 is arranged on the green electron blocking layer G-EBL, and the green second light-emitting sub-layer G-EML2 is arranged on the green first light-emitting sub-layer G-EML1; a blue electron blocking layer B-EBL disposed on the hole transport layer HTL at a position corresponding to the third anode, wherein a blue light-emitting layer B-EBL having a blue fluorescent light-emitting material is disposed on the blue electron blocking layer B-EBL; and a bulk hole blocking layer HBL disposed on the green second light-emitting sub-layer G-EML2, the red second light-emitting sub-layer R-EML2, and the blue light-emitting layer B-EML, a bulk electron transport layer ETL disposed on the hole blocking layer HBL, a bulk electron injection layer EIL disposed on the electron transport layer ETL, and a bulk cathode disposed on the electron injection layer EIL.

As shown in FIG. 2, the pixel unit in this embodiment may further include a light extraction layer CPL and an encapsulation layer disposed on the light extraction layer CPL on the monolithic cathode.

In the display panel as described above, since the red OLED and the green OLED in the pixel unit both adopt the super-fluorescent OLED devices with TADF luminous characteristics, replacing the red OLED and the green OLED based on a phosphorescence mechanism in the related art, to combine with the blue fluorescent OLED device in the conventional technology, a full-color display is achieved, and the efficiency of the red and green OLED sub-pixels can be taken into consideration while the output efficiency of the blue OLED is maximized, thereby achieving an efficient full-color scheme.

Specifically, the first anode, the second anode, and the third anode of the three-color OLEDs of the pixel unit of the present embodiment are formed by patterning an anode layer electrode material on the substrate. The anode layer electrode material has high reflectivity (for example, the reflectivity at the wavelength of 550 nm should be more than 85%) in the visible light region, and has high work function. The first anode, the second anode and the third anode of the present application each may be a composite electrode formed by Ag/ITO, Al/ITO, Ag/IZO, Al/IZO, etc., wherein a thickness of a metal in the composite electrode is generally in the range of 80 nm to 200 nm, and a thickness of an ITO or IZO oxide layer is generally in the range of 5 nm to 20 nm. The present disclosure is not limited thereto.

The hole injection layer HIL may include a hole injection material such as CuPc, HATCN, MnO3, or may be formed by performing p-type doping in a hole transport material. The hole injection layer HIL has a thickness in the range of 5 nm to 30 nm. The hole injection layer HIL may be formed by a co-evaporation process of a plurality of sources.

The hole transport layer HTL may be formed of a material having good hole transport characteristics. The thickness of the hole transport layer HTL is constrained by the optical microcavity conditions of the blue OLED device, i.e., it can be used as a part of the microcavity regulation layer of the blue OLED device to control the blue color coordinate. The hole transport layer HTL may be formed by an evaporation process.

The red microcavity regulation layer R-Cavity Controller may be formed of a hole transport material with high mobility, and the difference between the HOMO energy level of the material of the red microcavity regulation layer R-Cavity Controller and the HOMO energy level of the material of the hole transport layer HTL should be no greater than 0.2 eV. The emergent light color coordinate of the red OLED device may be adjusted by changing the thickness of the red microcavity regulation layer.

The difference between the T1 energy level of the material of the red electron blocking layer R-EBL and the T1 energy level of the TADF sensitizer in the red first light-emitting sub-layer should be at least more than 0.1 eV. The difference between the HOMO energy level of the material of the red electron blocking layer R-EBL and the HOMO energy level of the host material of the red first light-emitting sub-layer is no more than 0.2 eV. The red electron blocking layer R-EBL may be formed by evaporation. In addition, if the hole mobility of the material of the red electron blocking layer R-EBL is high, it can also function as a red microcavity regulation layer, and at this time, the difference between the HOMO energy level thereof and the HOMO energy level of the material of the hole transport layer HTL should be no greater than 0.2 eV.

The pixel unit in this embodiment includes the organic light emitting diode in the above embodiment of this application, which includes a red first light-emitting sub-layer R-EML1 and a red second light-emitting sub-layer R-EML2.

The thickness of the red first light-emitting sub-layer R-EML1 may range from 10 nm to 30 nm, and the red first light-emitting sub-layer R-EML1 may include three components of a red host material A, a TADF sensitizer B, a red fluorescent guest material C (which does not belong to a TADF material). The doping concentration of the red fluorescent guest material C is 0.5-3%, the mass ratio of the red host material A to the sensitizer B is X, and X is 5% to 50%. The red host material A in the red first light-emitting sub-layer R-EML1 is a bipolar material with a hole mobility at least 1 order of magnitude higher than its electron mobility. The S1 energy levels and the T1 energy levels of three materials of the red host material A, the TADF sensitizer B and the red fluorescent guest material C are required to meet the following requirements: the difference between the S1 energy level and the T1 energy level of the red host material is greater than 0.2 eV; the difference between the S1 energy level and the T1 energy level of the sensitizer B is less than 0.2 eV; the difference between the S1 energy level and the T1 energy level of the red fluorescent guest material is greater than 0.2 eV, i.e., S1(A)−T1(A)>0.2 eV; S1(B)−T1(B)<0.2 eV; S1(C)−T1(C)>0.2 eV. The TADF sensitizer B has delayed fluorescence characteristics. The S1 energy levels of the three materials of the red host material A, the TADF sensitizer B and the red fluorescent guest material C need to meet the following requirements: the S1 energy level of the red host material A is greater than the S1 energy level of the sensitizer B, the S1 energy level of the sensitizer B is greater than the S1 energy level of the red fluorescent guest material C, i.e., S1(A)>S1(B)>S1(C), and the T1 energy levels of the red host material A and the TADF sensitizer B meet the following requirements: the T1 energy level of the red host material a is greater than the T1 energy level of the sensitizer B, i.e., T1(A)>T1(B). The HOMO energy levels of the red host material A and the sensitizer B need to satisfy: an absolute value of a difference between the HOMO energy level of the red host material and the HOMO energy level of sensitizer B is less than 0.2 eV, i.e., |HOMO(A)−HOMO(B)|<0.2 eV. The absolute value of the difference between the LUMO energy level of the sensitizer B and the LUMO energy level of the red host material A is greater than 0.3 eV, i.e. |LUMO(B)−LUMO(A)|>0.3 eV. The absolute value of the difference obtained by subtracting the S1 energy level of the sensitizer B from the absolute value of the difference between the HOMO energy level of the red host material A and the LUMO energy level of the sensitizer B is less than 0.2 eV, i.e., ||HOMO(A)−LUMO(B)|−S1(B)|<0.2 eV, and the absolute value of the difference obtained by subtracting the T1 energy level of the sensitizer B from the absolute value of the difference between the HOMO energy level of the red host material A and the LUMO energy level of the sensitizer B is less than 0.2 eV, i.e., ||HOMO(A)−LUMO(B)|−T1(B)|<0.2 eV. The absorption spectrum of the red fluorescent guest material C needs to overlap greatly with the electroluminescence spectrum of the sensitizer B, and the overlapping area therebetween needs to be larger than 70% of the area of the electroluminescence spectrum of the sensitizer B, as shown in FIG. 5. The wavelength difference between the lowest energy absorption peak of the red fluorescent guest material C and the electroluminescence peak of the sensitizer B is not more than 20 nm, as shown in FIG. 5. The wavelength of the strongest emission peak of the red host material A is greater than that of the strongest emission peak of the sensitizer B, and the wavelength of the strongest emission peak of the sensitizer B is greater than that of the strongest emission peak of the red fluorescent guest material C, i.e., λ(A)>λ(B)>λ(C). In the present disclosure, the red first light-emitting sub-layer R-EML1 may be formed by a multi-source co-evaporation process.

A thickness of the red second light-emitting sub-layer R-EML2 ranges from 1 nm to 10 nm, and the red second light-emitting sub-layer R-EML2 includes the red host material A and the TADF sensitizer B. Alternatively, the red second light-emitting sub-layer R-EML2 includes the red host material A and does not include the TADF sensitizer B. The ratio of the thickness of the red second light-emitting sub-layer R-EML2 to the thickness of the red first light-emitting sub-layer R-EML1 should be less than ½. In one embodiment, the thickness of the red second light-emitting sub-layer may be less than 6 nm. When the red second light-emitting sub-layer R-EML2 includes the red host material A and the TADF sensitizer B, the mass ratio of the red host material A to the TADF sensitizer B in the red second light-emitting sub-layer R-EML2 is the same as the mass ratio of the red host material A to the TADF sensitizer B in the red first light-emitting sub-layer R-EML1.

The green microcavity regulation layer G-Cavity Controller may comprise a hole transport material with high hole mobility, and the difference between the HOMO energy level of the green microcavity regulation layer G-Cavity Controller and the HOMO energy level of the material of the HTL layer should be no more than 0.2 eV. The green emergent light color coordinate may be adjusted by changing the thickness of the green microcavity regulation layer.

The difference between the T1 energy level of the material of the green electron blocking layer G-EBL and the T1 energy level of the TADF sensitizer in the green first light-emitting sub-layer needs to be at least more than 0.1 eV. The difference between the HOMO energy level of the material of the green electron blocking layer G-EBL and the HOMO energy level of the green host material of the green first light-emitting sub-layer is no more than 0.2 eV. The green electron blocking layer G-EBL may be formed by evaporation. In addition, if the hole mobility of the green electron blocking layer G-EBL material is high, it may also function as a green microcavity regulation layer, and at this time, the difference between the HOMO energy level of the material of the green electron blocking layer G-EBL and the HOMO energy level of the material of the hole transport layer HTL should be no greater than 0.2 eV.

The thickness of the green first light-emitting sub-layer G-EML1 is within the range of 10 nm to 30 nm, and the green first light-emitting sub-layer G-EML includes three components including a green host material D, a TADF sensitizer E and a green fluorescent guest material F (which does not belong to a TADF material). The doping concentration of the green fluorescent guest material F is 0.5-3%, the mass ratio of the green host material D to the sensitizer E is Y, and the mass ratio of Y is 5% to 50%. The green host material D in the green first light-emitting sub-layer G-EML1 is a bipolar material with a hole mobility at least one order of magnitude higher than the electron mobility. The S1 energy level and the T1 energy level of each of the three materials of the green host material D, the TADF sensitizer E and the green fluorescent guest material F need to satisfy the following: the difference between the S1 energy level and the T1 energy level of the green host material is greater than 0.2 eV; the difference between the S1 energy level and the T1 energy level of the sensitizer E is less than 0.2 eV; the difference between the S1 energy level and the T1 energy level of the green fluorescent guest material F is greater than 0.2 eV, i.e., S1(D)−T1(D)>0.2 eV, S1(E)−T1(E)<0.2 eV, S1(F)−T1(F)>0.2 eV. The TADF sensitizer E has delayed fluorescence characteristics. The S1 energy levels of the three materials, namely, the green host material D, the TADF sensitizer E and the green fluorescent guest material F, are required to satisfy that the S1 energy level of the green host material D is greater than the S1 energy level of the sensitizer E, the S1 energy level of the sensitizer E is greater than the S1 energy level of the green fluorescent guest material F, i.e., S1(D)>S1(E)>S1(F), and the T1 energy levels of the two materials, namely, the green host material D and the TADF sensitizer E, are required to satisfy that: T1(D)>T1(E). The HOMO energy levels of the green host material D and the sensitizer E need to satisfy: the absolute value of the difference between the HOMO energy level of the green host material D and the HOMO energy level of the sensitizer E is less than 0.2 eV, i.e., |HOMO(D)−HOMO(E)|<0.2 eV. The absolute value of the difference between the LUMO energy level of the sensitizer E and the LUMO energy level of the green host material D is greater than 0.3 eV, i.e., |LUMO(E)−LUMO(D)|>0.3 eV. The absolute value of the difference obtained by subtracting the S1 energy level of the sensitizer E from the absolute value of the difference between the HOMO energy level of the green host material D and the LUMO energy level of the sensitizer E is less than 0.2 eV, i.e., |HOMO(D)−LUMO(E)−S1(E)|<0.2 eV, and the absolute value of the difference obtained by subtracting the T1 energy level of the sensitizer E from the absolute value of the difference between the HOMO energy level of the green host material D and the LUMO energy level of the sensitizer E is less than 0.2 eV, i.e., |HOMO(D)−LUMO(E)−T1(E)|<0.2 eV. The absorption spectrum of the green fluorescent guest material F needs to overlap with the electroluminescence spectrum of the sensitizer E by a large amount, and the overlapping area therebetween needs to be larger than 70% of the area of the electroluminescence spectrum of the sensitizer E, as shown in FIG. 5. The wavelength difference between the lowest energy absorption peak of the green fluorescent guest material F and the electroluminescence peak of the sensitizer E is no more than 20 nm, as shown in FIG. 5. The wavelength of the strongest emission peak of the green host material D is greater than the wavelength of the strongest emission peak of the sensitizer E, and the wavelength of the strongest emission peak of the sensitizer E is greater than the wavelength of the strongest emission peak of the green fluorescent guest material F, i.e., λ(D)>λ(E)>λ(F). In the present disclosure, the green first light-emitting sub-layer G-EML1 may be formed by a multi-source co-evaporation process.

The thickness of the green second light-emitting sub-layer G-EML2 is in a range of 1 nm to 10 nm, and the green second light-emitting sub-layer G-EML2 includes the green host material D and the TADF sensitizer E. Alternatively, the green second light-emitting sub-layer G-EML2 includes the green host material D without including the TADF sensitizer E. The ratio of the thickness of the green second light-emitting sub-layer to the thickness of the green first light-emitting sub-layer should be less than ½. In one embodiment, the thickness of the green second light-emitting sub-layer is less than 6 nm. When the green second light-emitting sub-layer G-EML2 includes the green host material D and the TADF sensitizer E, the ratio between the mass percentage of the green host material D in the green second light-emitting sub-layer G-EML2 and the mass percentage of the TADF sensitizer E in the green second light-emitting sub-layer G-EML2 is a first ratio; the ratio between the mass percentage of the green host material D in the green first light-emitting sub-layer G-EML1 and the mass percentage of the TADF sensitizer E in the green first light-emitting sub-layer G-EML1 is a second ratio, wherein the first ratio and the second ratio are substantially the same, for example, the mass percentage of the sensitizer E in the first light-emitting sub-layer G-EML1 and the mass percentage of the sensitizer E in the second light-emitting sub-layer G-EML2 are both 70%, while the mass percentage of the green host material in the first light-emitting sub-layer is 29%, the other 1% in the first light-emitting sub-layer is the green fluorescent guest material, and the mass percentage of the green host material in the second light-emitting sub-layer may be 30%.

The thickness of the blue electron blocking layer B-EBL (also referred to as an exciton blocking layer) is in the range of 3 nm to 10 nm. The difference between the T1 energy level of the material of the blue electron blocking layer B-EBL and the T1 energy level of the blue host material in the blue light-emitting layer is at least greater than 0.1 eV.

The blue light-emitting layer B-EML includes a blue host material G and a blue guest material H. For example, the blue host material G may be selected from anthracene, fluorene, and pyrene derivatives, and the electron mobility of the blue host material G is at least 1 order of magnitude higher than the hole mobility of the blue host material G. The blue guest material H may be selected from fluorenes and pyrenes, and the doping concentration of the blue guest material H is within the range of 0.5%-5%.

The thickness of the hole blocking layer HBL is within the range of 5 nm to 30 nm, and a hole blocking material J contained in the hole blocking layer HBL needs to simultaneously meet the following energy level requirements: the difference between the T1 energy level of the hole blocking material J and the T1 energy level of the TADF sensitizer B is greater than 0.1 eV, the difference between the T1 energy level of the hole blocking material J and the T1 energy level of the TADF sensitizer E is greater than 0.1 eV, and the difference between the T1 energy level of the hole blocking material J and the T1 energy level of the blue host material G is greater than 0.1 eV; the difference between the HOMO energy level of the hole blocking material J and the HOMO energy level of the red host material A is greater than 0.2 eV, the difference between the HOMO energy level of the hole blocking material J and the HOMO energy level of the green host material D is greater than 0.2 eV, the difference between the HOMO energy level of the hole blocking material J and the HOMO energy level of the blue host material G is greater than 0.2 eV, that is: $T1(J)>T1(B)+0.1$ eV, $T1(J)>T1(E)+0.1$ eV, $T1(J)>T1(G)+0.1$ eV; $HOMO(J)>HOMO(A)+0.2$ eV, $HOMO(J)>HOMO(D)+0.2$ eV, $HOMO(J)>HOMO(G)+0.2$ eV.

The electron transport layer EIL may be formed by evaporation of an electron transport material having good electron transport characteristics, or may be formed by doping an electron transport material with LiQ3, Li, Ca, or the like at a certain ratio. The thickness of the electron transport layer EIL is in a range of 10 nm to 70 nm.

The electron injection layer EIL may be formed by evaporation of a low work function metal such as Li, Ca, Yb or a metal salt such as LiF, LiQ3. The thickness of the electron injection layer EIL is within the range of 0.5 nm to 2 nm.

The thickness of the semi-reflection cathode layer is within the range of 10 nm to 20 nm, and the semi-reflection cathode layer may be a Mg:Ag alloy or a metal such as Al, Mg. The semi-reflection cathode layer needs to have a certain transmittance in a visible light region, for example, the transmittance at a 550 nm wavelength is 40% to 55%, and the square resistance of the semi-reflection cathode layer needs to be 10 Ω/□.

The light extraction layer (CPL) is made of an organic small-molecular material with a refractive index larger than 1.8 and has a thickness range in a range of 50 nm to 100 nm.

The encapsulation layer may be formed by using a UV sealant or a film encapsulation method.

In addition, the total thickness of each of the top-emission devices of the red OLED, the green OLED and the blue OLED is required to satisfy the optical length of the microcavity emission, so that the most efficient optical output is obtained.

The pixel unit of the OLED display panel shown in FIG. 2 includes a red OLED, a green OLED, and a blue OLED for achieving a full-color display, and the green OLED and the red OLED each adopt a light-emitting layer of the double-layer structure (a first light-emitting sub-layer and a second light-emitting sub-layer) proposed in the present disclosure and based on the super-fluorescent technology of the TADF sensitizer, and a super-fluorescent red OLED and a super-fluorescent green OLED are obtained. The super-fluorescent red OLED and the super-fluorescent green OLED with the double-layer light-emitting layers can be adapted to a conventional blue-fluorescent OLED structure, so that the optical output of the blue-fluorescent OLED is maximized, and an efficient full-color scheme of a pixel unit is achieved.

Figure 3A:
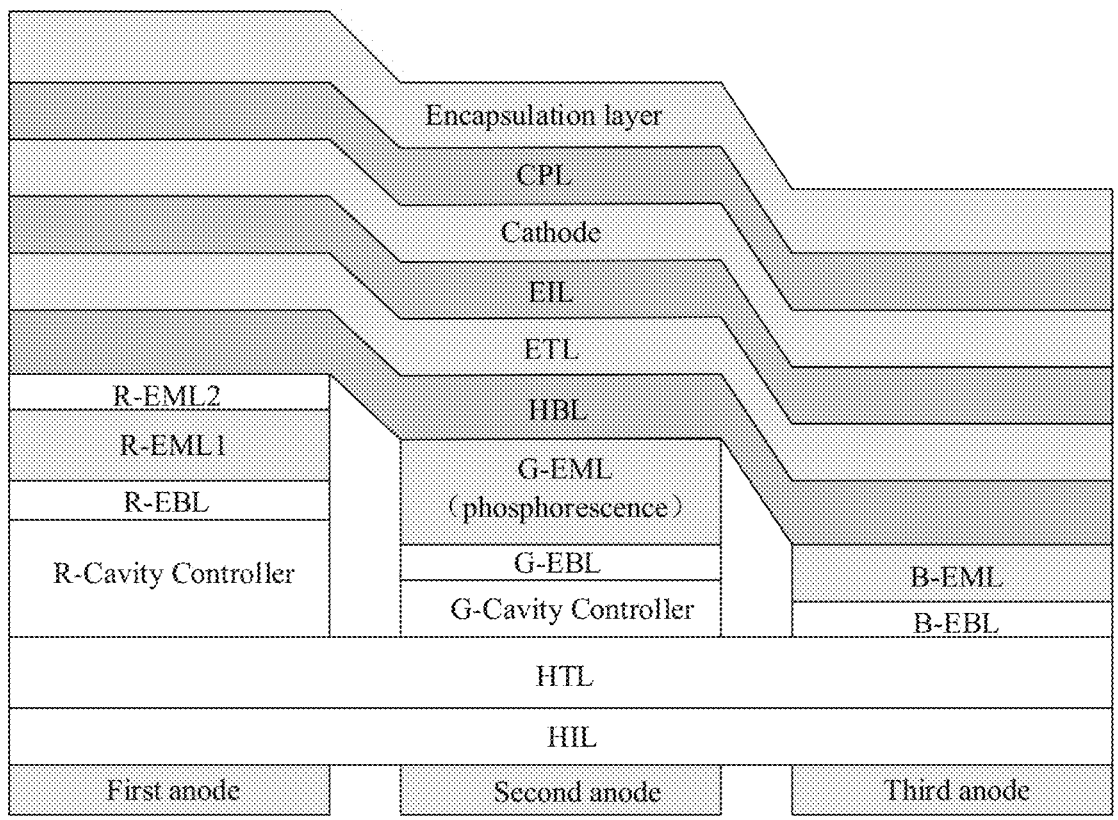
FIGS. 3A and 3B each illustrate a schematic structural diagram of a pixel unit according to an embodiment of the disclosure.

However, the present disclosure is not limited thereto. As shown in FIG. 3A, in one embodiment of the present disclosure, each pixel unit of the display panel includes a red OLED sub-pixel, a green OLED sub-pixel, and a blue OLED sub-pixel. The red OLED sub-pixel is a super-fluorescent red OLED employing the dual light-emitting layer structure of the present disclosure, i.e., the red OLED includes a red first light-emitting sub-layer R-EML1 including a red host material, a red TADF sensitizer, and a red fluorescent guest material, and a red second light-emitting sub-layer R-EML2 including the red host material and the red TADF sensitizer, as described above, wherein the red second light-emitting sub-layer is in contact with the red first light-emitting sub-layer and is closer to the cathode than the red first light-emitting sub-layer. In this embodiment, the light-emitting layer G-EML of the green OLED sub-pixel is a single layer structure based on a phosphorescent emission mechanism, and has a thickness approximately the same as the total thickness of the dual light-emitting layer of the red OLED.

Figure 3B:
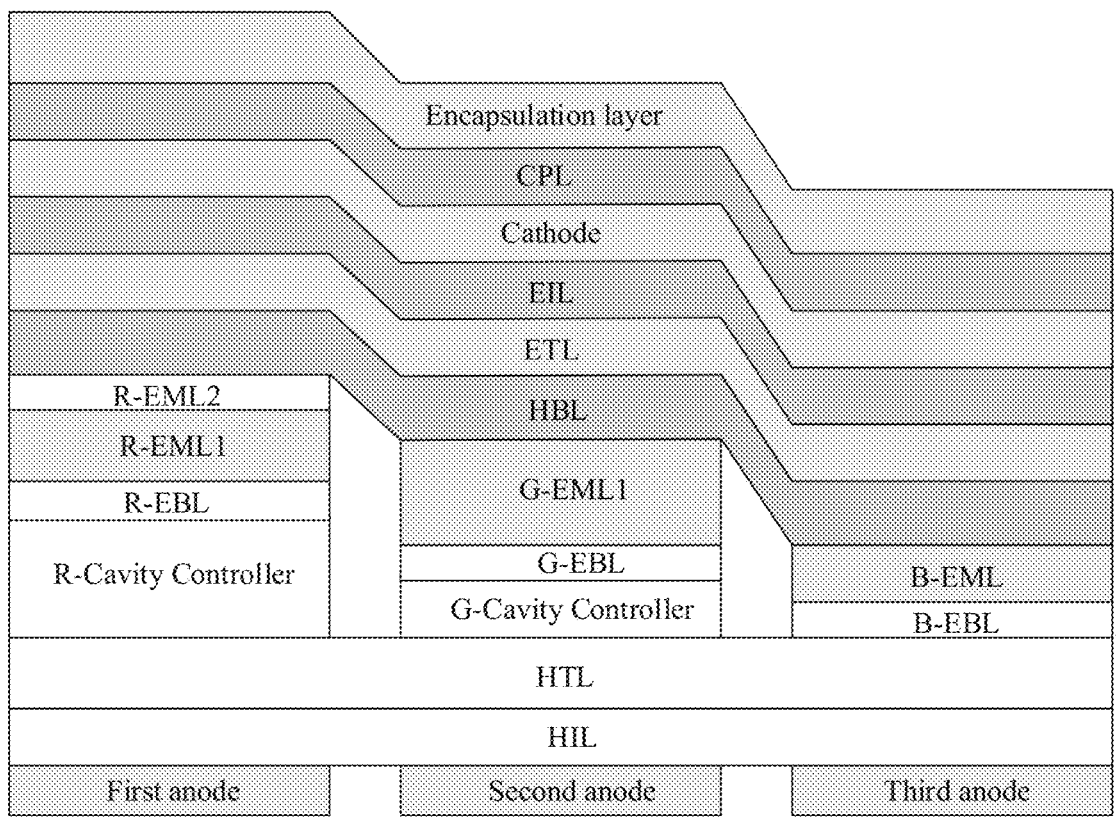

As shown in FIG. 3B, in one embodiment of the present disclosure, each pixel unit of the display panel includes a red OLED sub-pixel, a green OLED sub-pixel, and a blue OLED sub-pixel. The red OLED sub-pixel is a super-fluorescent red OLED employing the dual light-emitting layer structure of the present disclosure, i.e., the red OLED includes a red first light-emitting sub-layer R-EML1 including a red host material, a red TADF sensitizer, and a red fluorescent guest material, and a red second light-emitting sub-layer R-EML2 including the red host material and the red TADF sensitizer, or only including the red host material, as described above, wherein the red second light-emitting sub-layer is closer to the cathode than the red first light-emitting sub-layer. In this embodiment, the light-emitting layer of the green OLED sub-pixel is a single layer structure G-EML1, which is based on a super-fluorescent light-emitting mechanism, and has a thickness approximately the same as the total thickness of the light-emitting layer of the red OLED, but it does not include the second light-emitting sub-layer G-EML2, that is, a hole transport layer HBL is directly formed on the single light-emitting layer G-EML1.

Figure 4A:
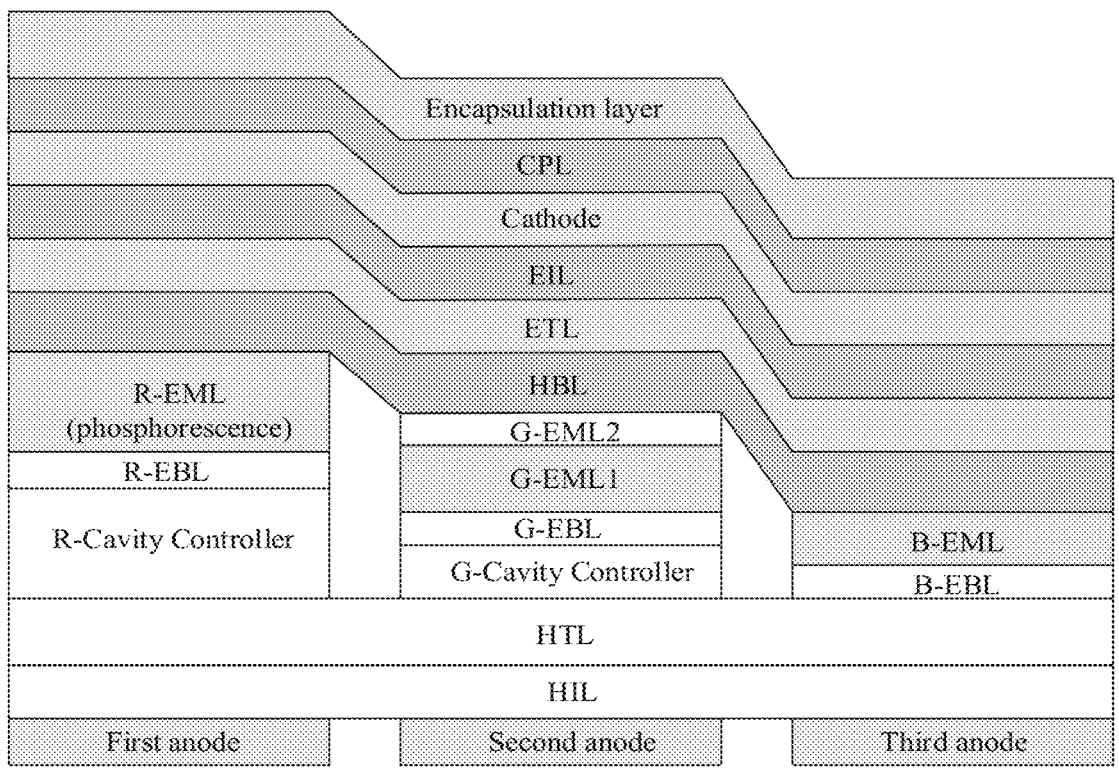
FIGS. 4A and 4B each illustrate a schematic structural diagram of a pixel unit according to an embodiment of the disclosure.

As shown in FIG. 4A, in one embodiment of the present disclosure, each pixel unit of the display panel includes a red OLED sub-pixel, a green OLED sub-pixel, and a blue OLED sub-pixel. The green OLED sub-pixel is a green super-fluorescent OLED employing the dual light-emitting layer structure of the present disclosure, that is, the green OLED includes a green first light-emitting sub-layer G-EML1 and a green second light-emitting sub-layer G-EML2, as described above. The green first light-emitting sub-layer includes a green host material, a green TADF sensitizer, and a green fluorescent guest material, and the green second light-emitting sub-layer includes the green host material and the green TADF sensitizer, wherein the green second light-emitting sub-layer is in contact with the green first light-emitting sub-layer and is closer to the cathode than the green first light-emitting sub-layer. In this embodiment, the light-emitting layer R-EML of the red OLED sub-pixel is a single layer structure based on a phosphorescence emission mechanism, and has a thickness approximately the same as the total thickness of the light-emitting layer of the green OLED.

Figure 4B:
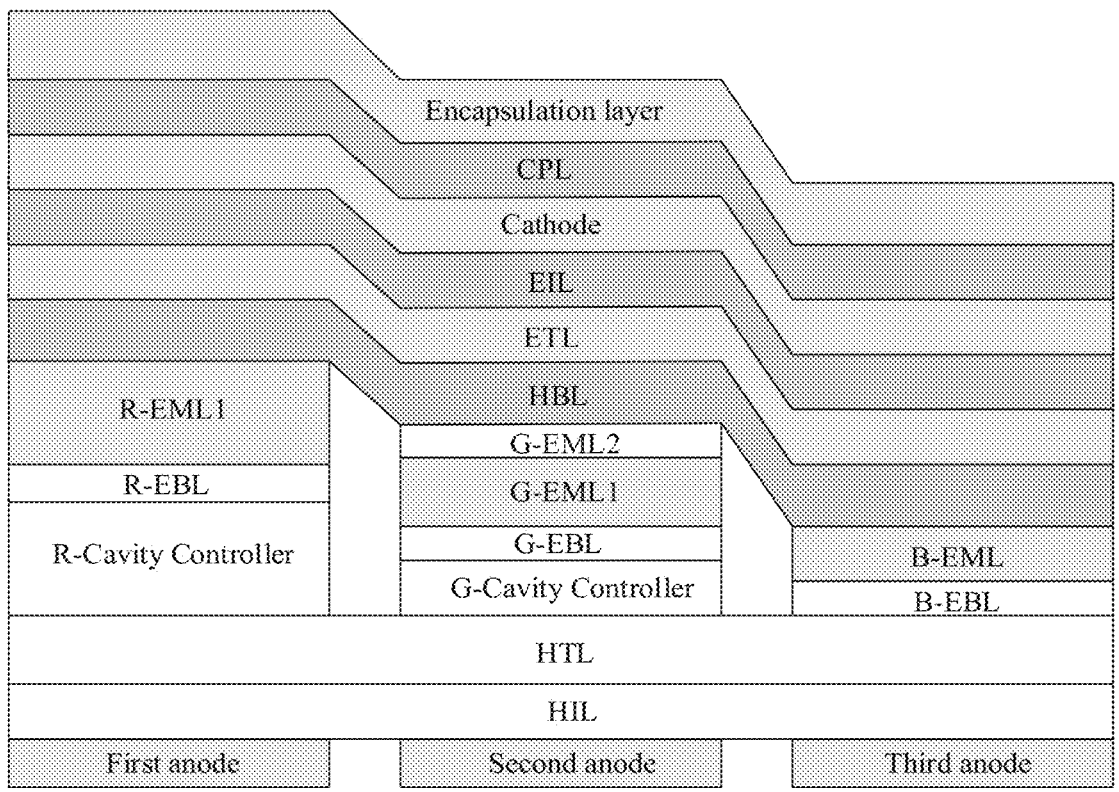

As shown in FIG. 4B, in one embodiment of the present disclosure, each pixel unit of the display panel includes a red OLED sub-pixel, a green OLED sub-pixel, and a blue OLED sub-pixel. The green OLED sub-pixel is a green super-fluorescent OLED employing the dual light-emitting layer structure of the present disclosure, that is, the green OLED includes a green first light-emitting sub-layer G-EML1 and a green second light-emitting sub-layer G-EML2, as described above, the green first light-emitting sub-layer includes a green host material, a green TADF sensitizer, and a green fluorescent guest material, and the green second light-emitting sub-layer includes the green host material and the green TADF sensitizer or only includes the green host material, and the green second light-emitting sub-layer is closer to the cathode than the green first light-emitting sub-layer. In this embodiment, the light-emitting layer of the red OLED sub-pixel is a single-layer structure R-EML1, which is based on a super-fluorescence emission mechanism, and has a thickness approximately the same as the total thickness of the light-emitting layer of the green OLED, but it does not include the second light-emitting sub-layer R-EML2, but instead the single-layer structure R-EML1 in direct contact with the hole transport layer.

The following description of the red OLED and the green OLED each having a dual light-emitting layer according to the present disclosure will be made with specific examples to achieve an efficient full-color display.

Table 1 shows layers with different parameters in Device 1, Device2 and Device3 of blue OLEDs in a comparison example 1:

TABLE 1

| Device ID | Device1 | Device2 | Device3 |
|---|---|---|---|
| HTL | M nm | (M − L) nm | (M − 2L) nm |
| ETL | N nm | (N + L) nm | (N + 2L) nm |

Except the layers shown in Table 1, the other layers of Device1, Device2, and Device3 shown in Table 1 use the same parameters, for example, the same material and the same thickness, for example, Ag (100 nm)/ITO (8 nm) for the anode, BH (blue host material):BD (blue guest material) (thickness 20 nm, doping concentration of blue guest material 3%) for the light-emitting layer, HBL-1 (thickness: 5 nm) for the hole blocking layer HBL, and 1 nm for the electron injection layer EIL, and Mg:Ag (thickness: 15 nm) for the cathode.

Table 2 shows layers with different parameters in Device4, Device5, and Device6 of red OLEDs in a comparison example 2:

TABLE 2

| Device ID | Device4 | Device5 | Device6 |
|---|---|---|---|
| HTL | M nm | (M − L) nm | (M − 2L) nm |
| ETL | N nm | (N + L) nm | (N + 2L) nm |

Except the layers shown in Table 2, the other layers of Device4, Device5, and Device6 shown in Table 2 use the same parameters, e.g., the same material and the same thickness, e.g., Ag (100 nm)/ITO (8 nm) for the anode, TM (red TADF sensitizer):TH (red host material):RD (red fluorescent guest material) (25 nm in thickness, 70%: 29%:1% in mass percentage for the three materials) for the light-emitting layer, HBL-2 (5 nm in thickness) for the hole blocking layer HBL, and 1 nm for the electron injection layer EIL; and Mg:Ag (thickness: 15 nm) for the cathode.

As can be seen from Table 1 above, thicknesses of the hole transport layers HTL of Device1, Device2 and Device3 are gradually decreased by L, thicknesses of the electron transport layers ETL of Device1, Device2 and Device3 are gradually increased, and Device1, Device2 and Device3 have the same overall thickness, and similarly, as can be seen from Table 2 above, thicknesses of the hole transport layers HTL of Device4, Device5 and Device6 are gradually decreased by L, thicknesses of the electron transport layers ETL of Device4, Device5 and Device6 are gradually increased, and Device4, Device5 and Device6 have the same overall thickness.

Table 3 shows layers with different parameters in Device7 of a blue OLED, and Device8, Device9 and Device10 of red OLEDs, which differ from each other only in parameters of the light-emitting layers:

TABLE 3

| Device ID | Device7 | Device8 | Device9 | Device10 |
|---|---|---|---|---|
| EML | BH BD (20 nm, 3%) | TM:TH:RD (22 nm, 70%:29%:1%)/ TM:TH (3 nm, 70%:30%) | TM:TH:RD (20 nm, 70%:29%:1%)/ TM:TH (5 nm, 70%:30%) | TM:TH:RD (18 nm, 70%:29%:1%)/ TM:TH (7 nm, 70%:30%) |

Except the layers shown in Table 3, the other layers of Device7, Device8, Device9, and Device10 shown in Table 3 use the same parameters, e.g., the same material and the same thickness, e.g., Ag (100 nm)/ITO (8 nm) for the anode, Mnm for the hole transport layer HTL, HBL-2 (5 nm) for the hole blocking layer HBL, Nnm for the thickness of the electron injection layer, 1 nm for the electron injection layer EIL; and Mg:Ag (thickness: 15 nm) for the cathode.

Device7 in Table 3 is a blue OLED, and its light-emitting layer EML is composed of the blue host material BH and the blue guest material BD, with a thickness of 20 nm and a doping ratio of the blue guest material in the light-emitting layer of 3%.

Device8, Device9, and Device10 in Table 3 are red OLEDs of the disclosed embodiments, and each of the three red OLED devices includes a light-emitting layer of a dual-layer structure.

For Device8, the first light-emitting sub-layer is TM:TH:RD (thickness: 22 nm, 70%:29%:1% of respective mass percentages of the three materials), and the second light-emitting sub-layer is TM:TH (thickness: 3 nm, 70%:30% of respective mass percentages of the two materials).

For Device9, the first light-emitting sub-layer is TM:TH:RD (thickness: 20 nm, 70%: 29%: 1% of respective mass percentages of the three materials), and the second light-emitting sub-layer is TM:TH (thickness: 5 nm, 70%: 30% of respective mass percentages of the two materials).

For Device10, the first light-emitting sub-layer is TM:TH: RD (thickness: 18 nm, 70%: 29%: 1% of respective mass percentages of the three materials), and the second light-emitting sub-layer is TM:TH (thickness: 7 nm, 70%: 30% of respective mass percentages of the two materials).

The first light-emitting sub-layers of Device8, Device9, and Device10 of the red OLEDs of the disclosed embodiments gradually decrease in thickness, while the second light-emitting sub-layers of Device8, Device9, and Device10 of the red OLEDs gradually increase in thickness, but the total thicknesses of the light-emitting layers of Device8, Device9, and Device10 of the red OLEDs are the same. As can be seen from Table 3, the mass ratio of the light-emitting host material TH to the sensitizer TM of the first light-emitting sub-layer of each of the Device8, Device9, and Device10 is substantially equal to the mass ratio of the light-emitting host material TH to the sensitizer TM of the second light-emitting sub-layer, with the minor difference that the first light-emitting sub-layer contains a small amount of the fluorescent guest material RD relative to the second light-emitting sub-layer, and the second light-emitting sub-layer does not contain the fluorescent guest material RD.

Table 4 below shows examples of energy levels of some materials in the respective layers described above.

TABLE 4

|  | HOMO | LUMO | T1 | S1 |
|---|---|---|---|---|
| TM | 5.8 | 2.6 | 2.70 | 3.48 |
| TH (TH) | 5.8 | 3.5 | 2.35 | 2.42 |
| RD | 5.6 | 3.6 | / | 2.03 |
| BH | 5.9 | 3.0 | 1.85 | / |
| HBL-1 | 6.2 | / | 2.50 | / |
| HBL-2 | 6.4 | / | 2.72 | / |

Table 4 shows the energy levels (eV) for respective parameters in the devices described above.

Tests were performed on Device1, Device2 and Device3 of the blue OLEDs in the comparison example 1 and Device4, Device5 and Device6 of the red OLEDs in the comparison example 2, and the following performance parameters were obtained for each device:

TABLE 5

| Device ID | Current density (mA/cm$^2$) | Voltage | Current efficiency (cd/A/CIEy) | CIE-x | CIE-y |
|---|---|---|---|---|---|
| Device1 | 15 | 100% | 100% | 0.144 | 0.037 |
| Device2 | 15 | 102% | 88% | 0.144 | 0.036 |
| Device3 | 15 | 103% | 64% | 0.143 | 0.036 |
| Device4 | 15 | 100% | 100% | 0.678 | 0.321 |
| Device5 | 15 | 100% | 132% | 0.677 | 0.323 |
| Device6 | 15 | 101% | 155% | 0.677 | 0.323 |

As can be seen from the test results of the above Table 5:

For Device1, Device2, and Device3 of the blue OLEDs, at similar color coordinates, the device efficiency decreases significantly as the thickness of the electron transport layer ETL increases.

For Device4, Device5, and Device6 of the red LOEDs, at similar color coordinates, the device efficiency increases significantly as the thickness of the electron transport layer ETL increases.

Therefore, in the related art, the blue OLED employing the fluorescence emission mechanism conflicts with the red OLED employing the super-fluorescence emission mechanism in the structural design. For example, when a full-color pixel unit is manufactured, if a common electron transport layer ETL is used (i.e., a red OLED sub-pixel and a blue OLED sub-pixel share the electron transport layer ETL), there is a contradiction that the characteristics of the sub-pixels of different colors cannot be harmonized (see FIG. 6). If respective separate electron transport layers ETL are adopted for the sub-pixels of different colors, it is required to add a mask process (FMM process) and a plurality of process chambers, which greatly increases the cost, and is not desirable in the actual production.

Figure 6:
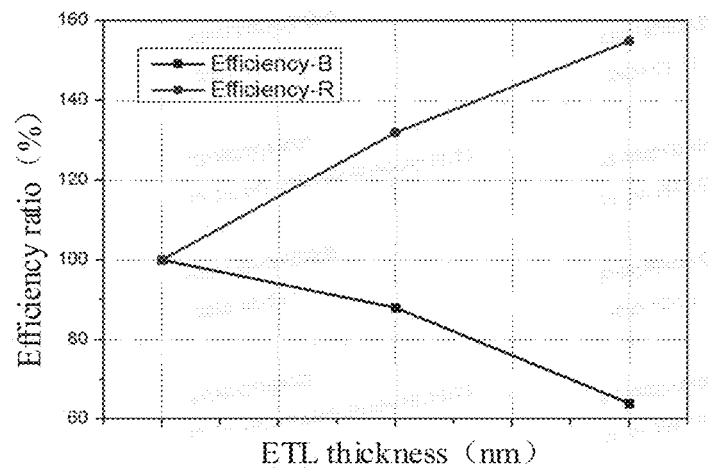
FIG. 6 is a schematic diagram illustrating relationship between device efficiency and thicknesses of electron transport layers of an organic light emitting diode.

The reason for the different dependencies of the red OLED and the blue OLED on the thicknesses of the electron transport layers as shown in FIG. 6 is: the different positions of the light-emitting centers, namely the light-emitting center of the blue OLED is farther away from the cathode, so that the efficiency of the blue OLED is reduced due to the increase of the thickness of the electron transport layer ETL; in contrast, the light-emitting center of the red OLED is closer to the cathode, and thus the increase in the thickness of the electron transport layer ETL can increase the light extraction efficiency of the red OLED.

Device1 of the blue OLED in the first comparison example 1, Device4 of the red OLED in the second comparison example 2, and Device7 of the blue OLED and Device8 of the red OLED in the embodiment were tested as below to obtain the following performance parameters for the respective devices:

TABLE 6

| Device ID | Current density (mA/cm$^2$) | Voltage | Current efficiency (cd/A/CIEy) | CIE-x | CIE-y |
|---|---|---|---|---|---|
| Device1 | 15 | 100% | 100% | 0.144 | 0.037 |
| Device7 | 15 | 102% | 99% | 0.144 | 0.038 |
| Device1 | 15 | 100% | 100% | 0.678 | 0.321 |
| Device8 | 15 | 105% | 88% | 0.679 | 0.321 |

Figure 7:
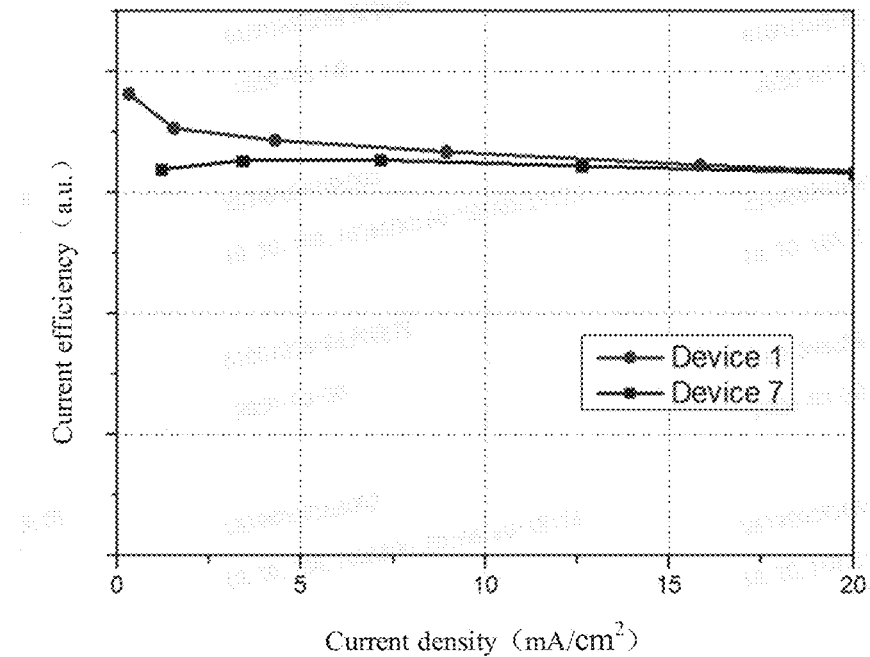
FIG. 7 is a schematic diagram illustrating relationship between current density and current efficiency of organic light emitting diodes having different hole blocking layers according to an embodiment of the present disclosure.
Figure 8:
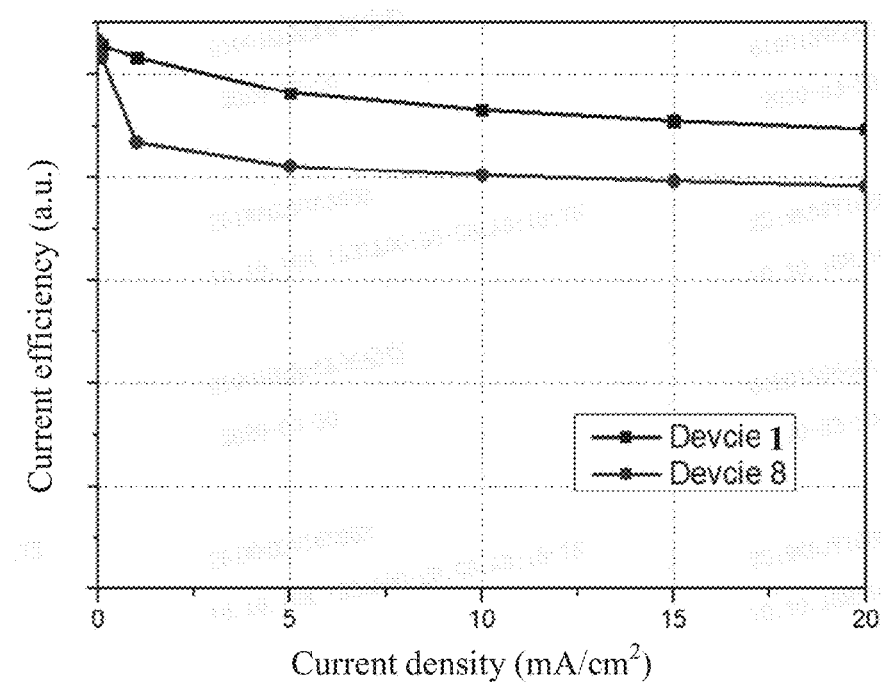
FIG. 8 is a schematic diagram illustrating relationship between current density and current efficiency of organic light emitting diodes having different hole blocking layers according to an embodiment of the present disclosure.

As shown in Table 6 and FIG. 7, compared with Device1, Device7 adopts a hole blocking layer HBL-2 with a deeper HOMO energy level and a higher T1 energy level to replace the hole blocking layer HBL-1. It can be seen from Table 6 that, the device voltage and current efficiency of Device7 are not significantly affected. Compared with Device8, Device1 adopts a hole blocking layer HBL-1 with a shallower HOMO energy level and a lower T1 energy level to replace the hole blocking layer HBL-2. The device voltage of Device8 increases significantly compared with Device1 and the efficiency decreases significantly (as shown in FIG. 8).

As can be seen from Table 3, Device8, Device9, and Device10 of the red OLEDs all employ the dual-layer light-emitting layer structure of the present disclosure, i.e., as shown in FIG. 1, the light-emitting layer includes a first light-emitting sub-layer and a second light-emitting sub-layer. As shown in Table 3, Device8, Device9 and Device10 of the red OLEDs each have a dual-layer light-emitting layer structure compared with Device4 of the red OLED. The first light-emitting sub-layer mainly includes three components of a red host material TH, a red sensitizer TM and a red fluorescent guest material RD; the second light-emitting sub-layer is mainly composed of the red host material TH and the red sensitizer TM, wherein the red sensitizer TM is a TADF material. In the first light-emitting layer and the second light-emitting sub-layer, the red sensitizer TM and the red host material TH maintain approximately the same mass ratio, and the difference is only that the first light-emitting sub-layer is further doped with the red fluorescent guest material RD, and the mass percentage of the red fluorescent guest material RD in the entire first light-emitting sub-layer shown in Table 3 is about 1%. For Device8, Device9 and Device10 of the red OLEDs, thicknesses of the second light-emitting sub-layers sequentially increase while thicknesses of the first light-emitting sub-layers gradually decrease, thereby keeping the overall thicknesses of the first light-emitting sub-layer and the second light-emitting sub-layer constant, the same as the thickness of the light-emitting layer of Device4. Device8, Device9 and Device10 all showed significant increase in efficiency compared with Device4, with Device10 having a peak efficiency and Device11 having a reduced efficiency as shown in below Table 7 and FIG. 9.

TABLE 7

| Device ID | Current density (mA/cm$^2$) | Voltage | Current efficiency (cd/A/CIEy) | CIE-x | CIE-y |
|---|---|---|---|---|---|
| Device4 | 15 | 100% | 100% | 0.678 | 0.321 |
| Device8 | 15 | 100% | 109% | 0.676 | 0.324 |
| Device9 | 15 | 101% | 123% | 0.675 | 0.325 |
| Device10 | 15 | 103% | 113% | 0.675 | 0.325 |

As described above, an example of adopting a double-layer light-emitting layer for a red OLED is explained. It should be noted herein that the light-emitting center of the green OLED having the light-emitting layer based on the TADF sensitizer is very similar to that of the red OLED, and is also at a position close to the cathode. Therefore, for the green OLED, the dual-layer light-emitting layer of the present disclosure may also be adopted, that is, the light-emitting layer of the green OLED includes a green first light-emitting sub-layer and a green second light-emitting sub-layer, where the green second light-emitting sub-layer is disposed closer to the cathode relative to the green first light-emitting sub-layer, and by adjusting the thickness of the second light-emitting sub-layer, the distance between the position of the light-emitting center and the cathode may be effectively adjusted, so that the efficiency of the green OLED may be effectively improved.

In the display panel shown in FIG. 2, the sub-pixel of the red OLED and the sub-pixel of the green OLED in one pixel unit each adopt the structure of the double-layer light-emitting layer proposed in the present disclosure: the red OLED includes a red first light-emitting sub-layer R-EML1 and a red second light-emitting sub-layer R-EML2, the red second light-emitting sub-layer R-EML2 being formed directly on the red first light-emitting sub-layer R-EML1 and being closer to the cathode than the red first light-emitting sub-layer R-EML1; the green OLED includes a green first light-emitting sub-layer G-EML1 and a green second light-emitting sub-layer G-EML2, the green second light-emitting sub-layer G-EML2 being formed directly on the green first light-emitting sub-layer G-EML1 and being closer to the cathode than the green first light-emitting sub-layer G-EML1.

The sub-pixel of the blue OLED in the pixel unit includes a blue light-emitting layer B-EML having a thickness substantially equal to that of the light-emitting layer of the red OLED (including the red first light-emitting sub-layer and the red second light-emitting sub-layer) and also substantially equal to that of the light-emitting layer of the green OLED (including the green first light-emitting sub-layer and the green second light-emitting sub-layer). The three OLEDs, i.e. the red OLED, the green OLED and the blue OLED, are top-emission devices, and the total thickness of each of the three OLEDs needs to satisfy the optical length for the microcavity emission, so that the most efficient optical output is obtained, which may be realized by adjusting the microcavity regulation layers in the red OLED and the green OLED, which will not be repeated herein.

As described above, in the double-layer light-emitting layer structure of the red OLED and the green OLED in the display panel, for example, the position the light-emitting center of the OLED can be adjusted through the thickness distribution of the first light-emitting sub-layer and the second light-emitting sub-layer, and therefore, for the pixel unit, a shared monolithic electron transport layer ETL may be adopted for each sub-pixel, as shown in FIG. 2, and therefore, the efficiency of the OLED can be improved without separately providing a separate electron transport layer ETL for each sub-pixel, and further, a monolithic electron transport layer ETL can be adopted in the procedure for manufacturing the full-color display panel, so as to improve the product manufacturing efficiency and save the cost.

The foregoing description of embodiments of the present disclosure has been presented for purposes of illustration and description. It is not intended to be exhaustive or to limit the disclosure to the precise form or exemplary embodiments disclosed. The foregoing description is, therefore, to be considered illustrative rather than restrictive. Obviously, many modifications and variations will be apparent to a person skilled in the art. The embodiments were chosen and described in order to explain the principles of the disclosure to enable a person skilled in the art to understand the disclosure for various embodiments and with various modifications as are suited to the particular use or implementation contemplated. It is intended that the scope of the disclosure will be defined by the appended claims and their equivalents.

What is claimed is:

1. An organic light emitting diode, comprising:
   a first electrode;
   a second electrode disposed opposite to the first electrode; and
   a light-emitting layer between the first electrode and the second electrode;
   wherein the light-emitting layer comprises a first light-emitting sub-layer and a second light-emitting sub-layer arranged on the first light-emitting sub-layer proximal to the second electrode;
   the first light-emitting sub-layer comprises a host material, a TADF sensitizer and a fluorescent guest material; and
   the second light-emitting sub-layer comprises the host material or comprises the host material and the TADF sensitizer; and
   wherein a difference between an S1 energy level and a T1 energy level of the host material is greater than 0.2 eV; a difference between an S1 energy level and a T1 energy level of the TADF sensitizer is less than 0.2 eV; and a difference between an S1 energy level and a T1 energy level of the fluorescent guest material is greater than 0.2 eV;
   the S1 energy level of the host material is greater than the S1 energy level of the TADF sensitizer, and the S1 energy level of the TADF sensitizer is greater than the S1 energy level of the fluorescent guest material; and the T1 energy level of the host material is greater than the T1 energy level of the TADF sensitizer.

2. The organic light emitting diode according to claim 1, wherein
a thickness of the first light-emitting sub-layer is in a range of 10 nm to 30 nm;
a thickness of the second light-emitting sub-layer is in a range of 1 nm to 10 nm; and
a ratio of the thickness of the second light-emitting sub-layer to the thickness of the first light-emitting sub-layer is less than ½.

3. The organic light emitting diode according to claim 2, wherein the thickness of the second light-emitting sub-layer is less than 6 nm.

4. The organic light emitting diode according to claim 3, wherein
the second light-emitting sub-layer further comprises the TADF sensitizer;
a ratio of a mass percentage of the host material in the first light-emitting sub-layer to a mass percentage of the host material in the second light-emitting sub-layer is 0.8-1.2; and
the mass percentage of the fluorescent guest material in the first light-emitting sub-layer is between 0.5% and 3%.

5. The organic light emitting diode according to claim 1, wherein
an absolute value of a difference between a HOMO level of the host material and a HOMO level of the TADF sensitizer is less than 0.2 eV;
an absolute value of a difference between a LUMO level of the host material and a LUMO level of the TADF sensitizer is greater than 0.3 eV;
an absolute value of a difference obtained by subtracting the S1 energy level of the TADF sensitizer from an absolute value of a difference between the HOMO energy level of the host material and the LUMO energy level of the TADF sensitizer is less than 0.2 eV; and
an absolute value of a difference obtained by subtracting the T1 energy level of the TADF sensitizer from an absolute value of a difference between the HOMO level of the host material and the LUMO level of the TADF sensitizer is less than 0.2 eV.

6. The organic light emitting diode according to claim 5, wherein
an overlapping area of an absorption spectrum of the fluorescent guest material and an electroluminescence spectrum of the TADF sensitizer is more than 70% of an area of the electroluminescence spectrum of the TADF sensitizer;
a difference between a wavelength of a lowest energy absorption peak of the fluorescent guest material and a wavelength of an electroluminescence peak of the TADF sensitizer is less than or equal to 20 nm; and
a wavelength of a strongest emission peak of the host material is greater than a wavelength of a strongest emission peak of the TADF sensitizer, and the wavelength of the strongest emission peak of the TADF sensitizer is greater than a wavelength of a strongest emission peak of the fluorescent guest material.

7. The organic light emitting diode according to claim 6, further comprising a hole blocking layer having a hole blocking material between the light-emitting layer and the second electrode, wherein
a difference between a T1 energy level of the hole blocking material and the T1 energy level of the TADF sensitizer is greater than 0.1 eV; and a difference between a HOMO level of the hole blocking material and the HOMO level of the host material is greater than 0.2 eV.

8. The organic light emitting diode according to claim 7, further comprising an electron blocking layer having an electron blocking material between the light-emitting layer and the first electrode, wherein
a difference between a T1 energy level of the electron blocking material and the T1 energy level of the TADF sensitizer is greater than 0.1 eV; and
a difference between a HOMO level of the electron blocking material and the HOMO level of the host material is less than or equal to 0.2 eV.

9. The organic light emitting diode according to claim 8, further comprising:
a hole injection layer, a hole transport layer and a microcavity regulation layer sequentially arranged between the first electrode and the electron blocking layer;
an electron transport layer and an electron injection layer sequentially arranged between the hole blocking layer and the second electrode;
a light extraction layer arranged on the second electrode; and
an encapsulation layer arranged on the light extraction layer.

10. An organic light emitting diode, comprising:
a first electrode;
a second electrode disposed opposite to the first electrode;
a light-emitting layer between the first electrode and the second electrode;
wherein the light-emitting layer comprises a first light-emitting sub-layer and a second light-emitting sub-layer arranged on the first light-emitting sub-layer proximal to the second electrode;
the first light-emitting sub-layer comprises a host material, a TADF sensitizer and a fluorescent guest material;
the second light-emitting sub-layer comprises the host material or comprises the host material and the TADF sensitizer, wherein
the first light-emitting sub-layer comprises a red host material, a red TADF sensitizer and a red fluorescent guest material, or
the first light-emitting sub-layer comprises a green host material, a green TADF sensitizer and a green fluorescent guest material.

11. A display panel, comprising a plurality of pixel units, each of which comprises a plurality of sub-pixels, wherein at least one of the plurality of sub-pixels comprises an organic light emitting diode, which comprises: a first electrode; a second electrode disposed opposite to the first electrode; a light-emitting layer between the first electrode and the second electrode; wherein the light-emitting layer comprises a first light-emitting sub-layer and a second light-emitting sub-layer arranged on the first light-emitting sub-layer proximal to the second electrode; the first light-emitting sub-layer comprises a host material, a TADF sensitizer and a fluorescent guest material; and the second light-emitting sub-layer comprises the host material or comprises the host material and the TADF sensitizer; and
the at least one sub-pixel comprises a first color sub-pixel, the first light-emitting sub-layer of the first color sub-pixel comprises a first color first light-emitting sub-layer, and the second light-emitting sub-layer of the first color sub-pixel comprises a first color second light-emitting sub-layer, wherein the first color first light-emitting sub-layer comprises a first host material, a first color TADF sensitizer, and a first color fluorescent guest material; and the first color second light-emitting sub-layer comprises the first color host material or comprises the first color host material and the first color TADF sensitizer; and
the first color is one of red and green.

12. The display panel according to claim 11, wherein
the first color is red;
the plurality of sub-pixels further comprise a green sub-pixel, which comprises a green light-emitting layer having a green phosphorescent light-emitting material or a green light-emitting layer having a green host material, a green TADF sensitizer, and a green fluorescent guest material; and
the plurality of sub-pixels further comprise a blue sub-pixel, which comprises a blue light-emitting layer having a blue fluorescent light-emitting material.

13. The display panel according to claim 12, wherein the plurality of sub-pixels comprise:
a first anode of the red sub-pixel, a second anode of the green sub-pixel and a third anode of the blue sub-pixel arranged on the substrate at intervals;
a monolithic hole injection layer on the first anode, the second anode and the third anode, and a monolithic hole transport layer on the hole injection layer;
a red microcavity regulation layer arranged on the hole transport layer at a position corresponding to the first anode, and a green microcavity regulation layer arranged on the hole transport layer at a position corresponding to the second anode, wherein the green light-emitting layer is arranged on the green microcavity regulation layer;
a red electron blocking layer arranged on the red microcavity regulation layer, the red first light-emitting sub-layer arranged on the red electron blocking layer, and the red second light-emitting sub-layer arranged on the red first light-emitting sub-layer;
a blue electron blocking layer arranged on the hole transport layer at a position corresponding to the third anode, wherein the blue light-emitting layer is arranged on the blue electron blocking layer; and
a monolithic hole blocking layer arranged on the red second light-emitting sub-layer, the green light-emitting layer and the blue light-emitting layer, a monolithic electron transport layer arranged on the hole blocking layer, a monolithic electron injection layer arranged on the electron transport layer, and a monolithic cathode arranged on the electron injection layer.

14. The display panel according to claim 11, wherein
the first color is green;
the plurality of sub-pixels further comprise a red sub-pixel, which comprises a red light-emitting layer having a red phosphorescent light-emitting material or a red light-emitting layer having a red host material, a red TADF sensitizer, and a red fluorescent guest material; and
the plurality of sub-pixels further comprise a blue sub-pixel which comprises a blue light-emitting layer having a blue fluorescent light-emitting material.

15. The display panel according to claim 14, wherein the plurality of sub-pixels comprise:
a first anode of the red sub-pixel, a second anode of the green sub-pixel and a third anode of the blue sub-pixel arranged on the substrate at intervals;
a monolithic hole injection layer on the first anode, the second anode and the third anode and a monolithic hole transport layer on the hole injection layer;
a red microcavity regulation layer arranged on the hole transport layer at a position corresponding to the first anode, and a green microcavity regulation layer arranged on the hole transport layer at a position corresponding to the second anode, wherein the red light-emitting layer is arranged on the red microcavity regulation layer;
a green electron blocking layer on the green microcavity regulation layer, a green first light-emitting sub-layer on the green electron blocking layer, and a green second light-emitting sub-layer on the green first light-emitting sub-layer;
a blue electron blocking layer on the hole transport layer at a position corresponding to the third anode, wherein the blue light-emitting layer is arranged on the blue electron blocking layer; and
a monolithic hole blocking layer arranged on the green second light-emitting sub-layer, the red light-emitting layer, and the blue light-emitting layer, a monolithic electron transport layer arranged on the hole blocking layer, a monolithic electron injection layer arranged on the electron transport layer and a monolithic cathode arranged on the electron injection layer.

16. The display panel according to claim 11, wherein the first color is green;
the at least one sub-pixel further comprises a red sub-pixel, the first light-emitting sub-layer of the red sub-pixel comprises a red first light-emitting sub-layer, and the second light-emitting sub-layer of the red sub-pixel comprises a red second light-emitting sub-layer, wherein the red first light-emitting sub-layer comprises a red host material, a red TADF sensitizer, and a red fluorescent guest material; the red second light-emitting sub-layer comprises the red host material or comprises the red host material and the red TADF sensitizer; and
the plurality of sub-pixels further comprise a blue sub-pixel, which comprises a blue light-emitting layer having a blue fluorescent light-emitting material.

17. The display panel according to claim 16, wherein the plurality of sub-pixels comprise:
a first anode of the red sub-pixel, a second anode of the green sub-pixel and a third anode of the blue sub-pixel arranged on the substrate at intervals;
a monolithic hole injection layer arranged on the first anode, the second anode and the third anode and a monolithic hole transport layer arranged on the hole injection layer;
a red microcavity regulation layer arranged on the hole transport layer a position corresponding to the first anode, and a red electron blocking layer arranged on the red microcavity regulation layer wherein the red first light-emitting sub-layer is arranged on the red electron blocking layer and the red second light-emitting layer is arranged on the red first light-emitting sub-layer;
a green microcavity regulation layer arranged on the hole transport layer a position corresponding to the second anode, and a green electron blocking layer arranged on the green microcavity regulation layer wherein the green first light-emitting sub-layer is arranged on the green electron blocking layer and the green second light-emitting layer is arranged on the green first light-emitting sub-layer;
a blue electron blocking layer arranged on the hole transport layer a position corresponding to the third anode wherein the blue light-emitting layer is arranged on the blue electron blocking layer; and a monolithic hole blocking layer on the green second light-emitting sub-layer, the red second light-emitting sub-layer and the blue light-emitting layer, a monolithic electron transport layer on the hole blocking layer, a monolithic electron injection layer on the electron transport layer and a monolithic cathode on the electron injection layer.

18. The display panel according to claim 17, wherein the blue light-emitting layer comprises a blue host material and a blue guest material;

a difference between a T1 energy level of a hole blocking material of the hole blocking layer and a T1 energy level of the blue host material is greater than 0.1 eV; and a difference between a HOMO level of the hole blocking material of the hole blocking layer and a HOMO level of the blue host material is greater than 0.2 eV.

19. A method for manufacturing the organic light emitting diode according to claim 1, comprising:

in a process chamber, simultaneously opening a host material evaporation source, a TADF sensitizer evaporation source and a fluorescent guest material evaporation source, to form the first light-emitting sub-layer comprising the host material, the TADF sensitizer and the fluorescent guest material through an evaporation process; and in the process chamber, simultaneously opening the host material evaporation source and the TADF sensitizer evaporation source and closing the fluorescent guest material evaporation source to form the second light-emitting sub-layer comprising the host material and the TADF sensitizer through an evaporation process, or in the process chamber, simultaneously opening the host material evaporation source and closing the fluorescent guest material evaporation source and the TADF sensitizer evaporation source to form the second light-emitting sub-layer comprising the host material through an evaporation process.

* * * * *